United States Patent [19]

Ogawa

[11] Patent Number: 4,811,297
[45] Date of Patent: Mar. 7, 1989

[54] BOUNDARY-FREE SEMICONDUCTOR MEMORY DEVICE

[75] Inventor: Junji Ogawa, Yokohama, Japan

[73] Assignee: Fujitsu Limited, Kawasaki, Japan

[21] Appl. No.: 132,442

[22] Filed: Dec. 14, 1987

[30] Foreign Application Priority Data

Dec. 16, 1986 [JP] Japan ............................... 61-297629
Dec. 17, 1986 [JP] Japan ............................... 61-298896

[51] Int. Cl.$^4$ .............................................. G11C 8/00
[52] U.S. Cl. ..................................... 365/189; 365/230
[58] Field of Search ................ 365/189, 230, 233, 221

[56] References Cited

U.S. PATENT DOCUMENTS

| | | | |
|---|---|---|---|
| 4,044,339 | 8/1977 | Berg ..................... | 365/189 |
| 4,498,155 | 2/1985 | Rao ...................... | 365/189 |
| 4,596,001 | 6/1986 | Baba ..................... | 365/189 |
| 4,618,947 | 10/1986 | Tran et al. ............. | 365/230 |

FOREIGN PATENT DOCUMENTS 59-110086 6/1984 Japan.
59-180324 10/1984 Japan.
61-58058 3/1986 Japan.

Primary Examiner—Joseph A. Popek
Attorney, Agent, or Firm—Armstrong, Nikaido Marmelstein & Kubovcik

[57] ABSTRACT

An entire chip is divided into N blocks ($N = n \times m$) in accordance with a desired rectangular group of bits ($n \times m$ bits). The same row decoder is provided for every m blocks, and a row address $A_R$ or a row address $A_{R+1}$ adjacent thereto is given to the row decoders. Similarly, the same column decoder is provided for every m blocks, and a column address $A_C$ or a column address $A_{C+1}$ adjacent thereto is given to the column decoders. N bits of memory cells are accessed from the blocks, and the accessed memory cells are rearranged, thereby obtaining a desired rectangular group of bits.

10 Claims, 32 Drawing Sheets

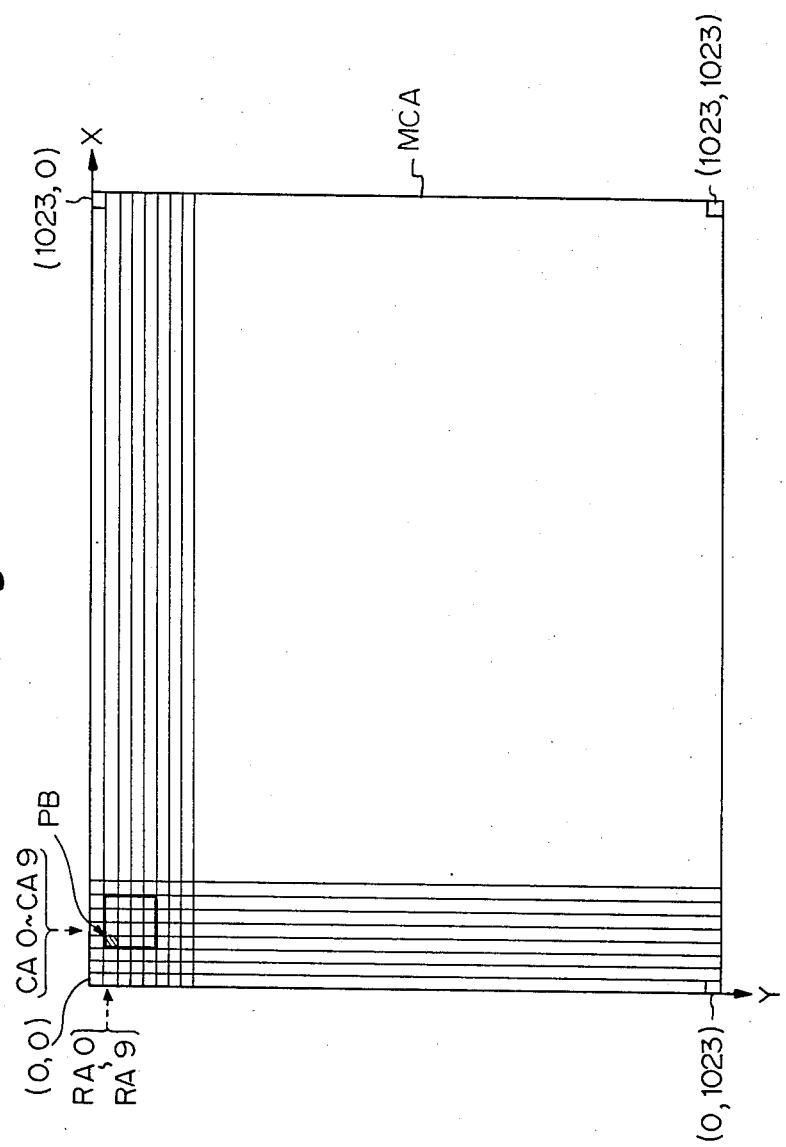

PB

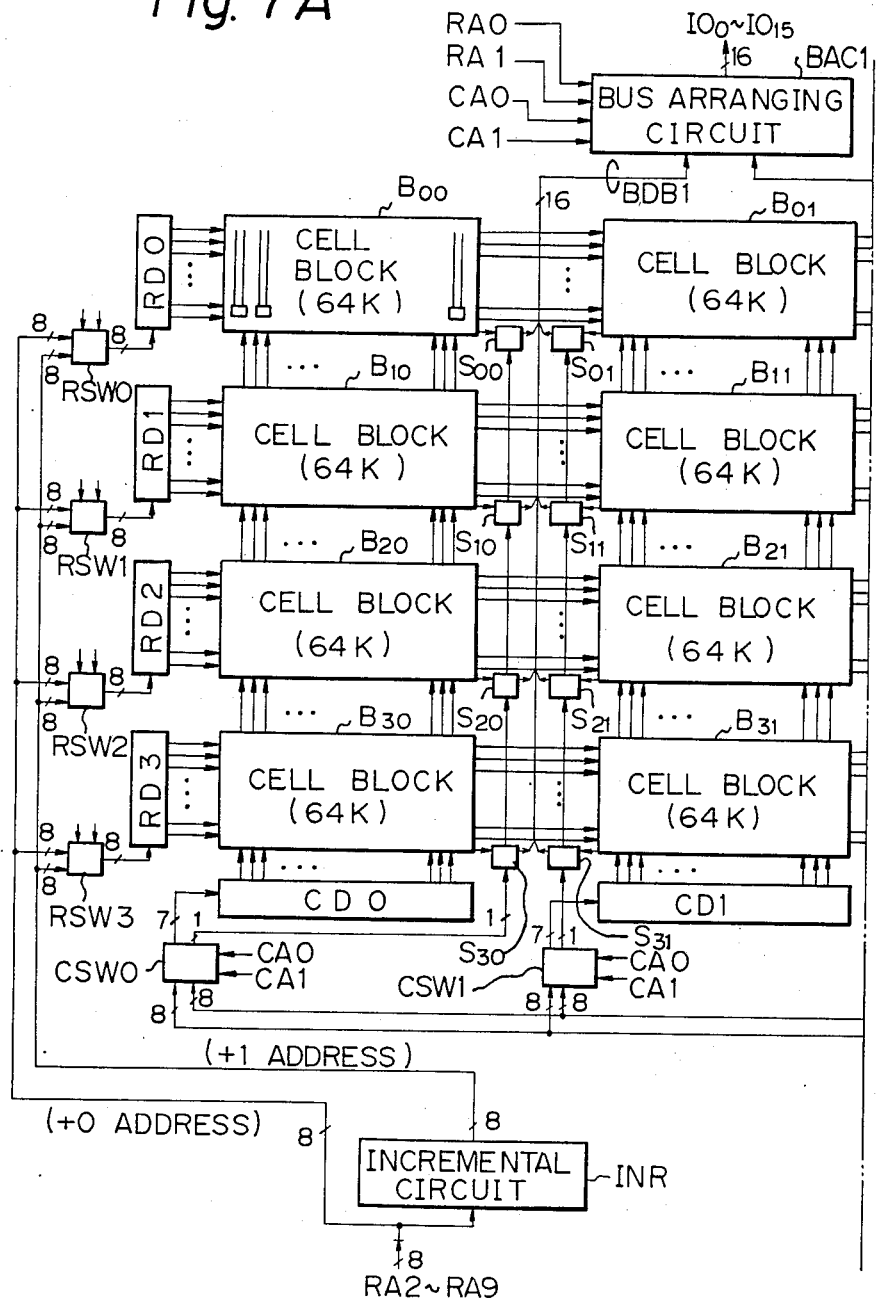

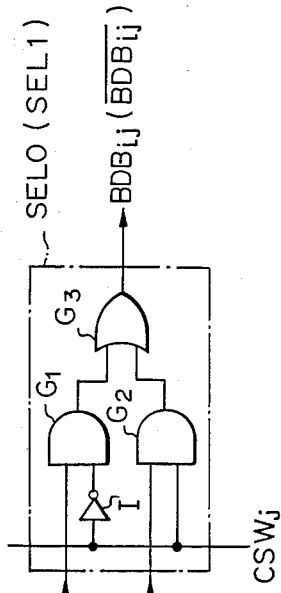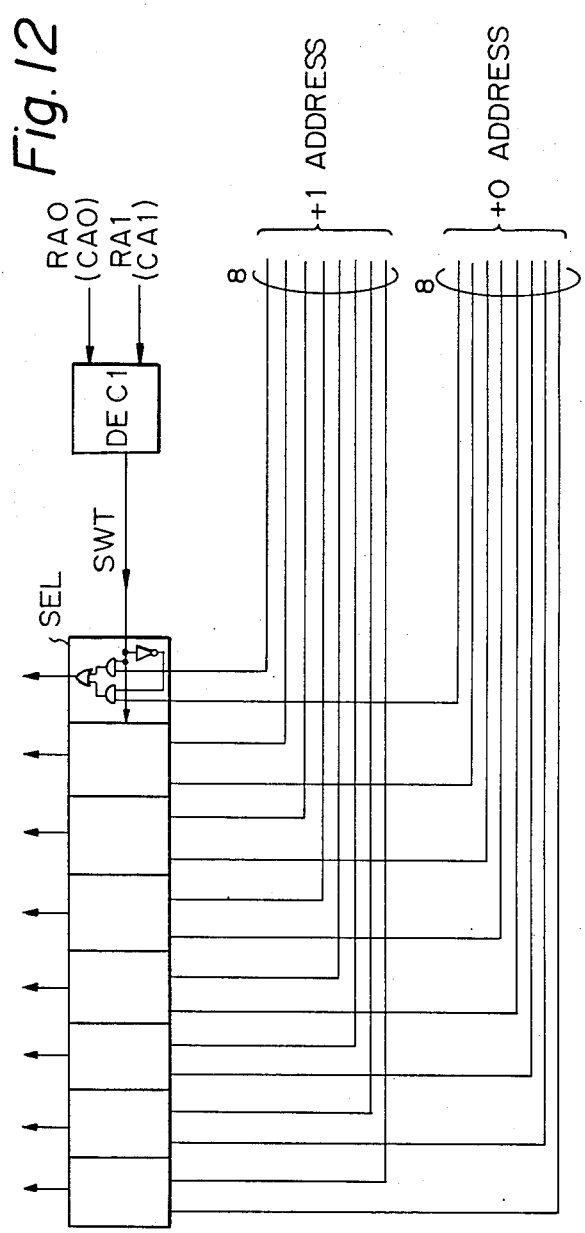

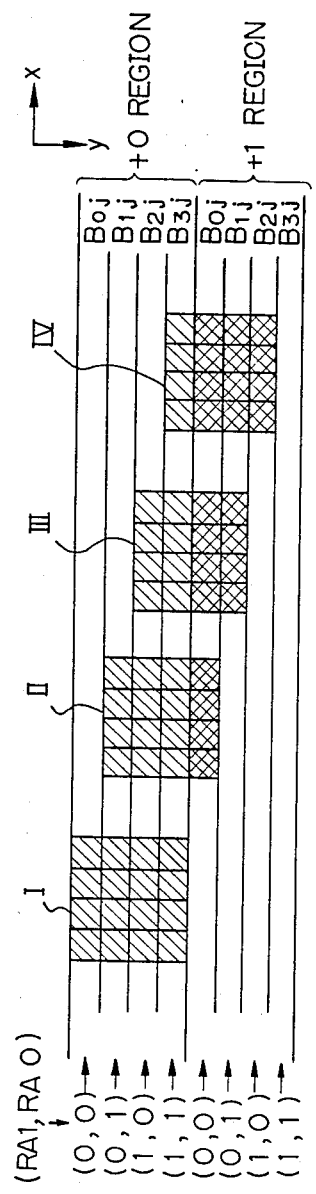

Fig. 17A

| PB↙ | | | |
|---|---|---|---|
| IO$_0$ | IO$_1$ | IO$_2$ | IO$_3$ |
| IO$_4$ | IO$_5$ | IO$_6$ | IO$_7$ |
| IO$_8$ | IO$_9$ | IO$_{10}$ | IO$_{11}$ |
| IO$_{12}$ | IO$_{13}$ | IO$_{14}$ | IO$_{15}$ |

Fig. 17B

| | PB | | |
|---|---|---|---|
| IO$_1$ | IO$_2$ | IO$_3$ | IO$_9$ |
| IO$_8$ | IO$_0$ | IO$_4$ | IO$_{10}$ |
| IO$_7$ | IO$_6$ | IO$_5$ | IO$_{11}$ |
| IO$_{15}$ | IO$_{14}$ | IO$_{13}$ | IO$_{12}$ |

Fig. 17C

| | PB | | |
|---|---|---|---|
| IO$_1$ | IO$_2$ | IO$_3$ | HZ |
| IO$_8$ | IO$_0$ | IO$_4$ | HZ |
| IO$_7$ | IO$_6$ | IO$_5$ | HZ |
| HZ | HZ | HZ | HZ |

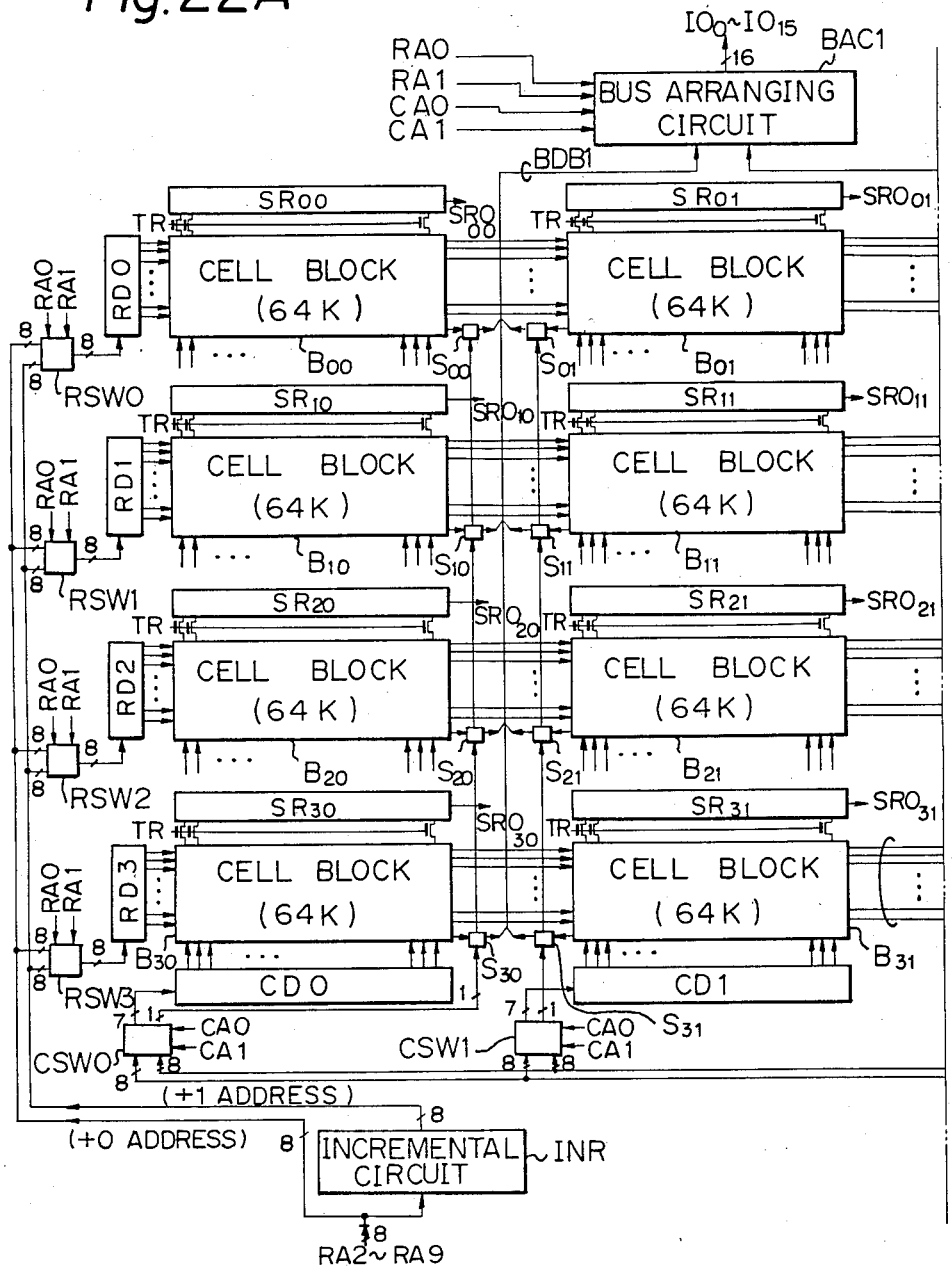

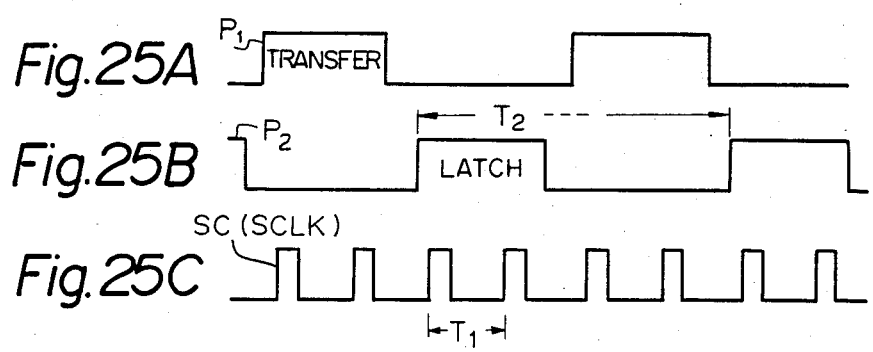
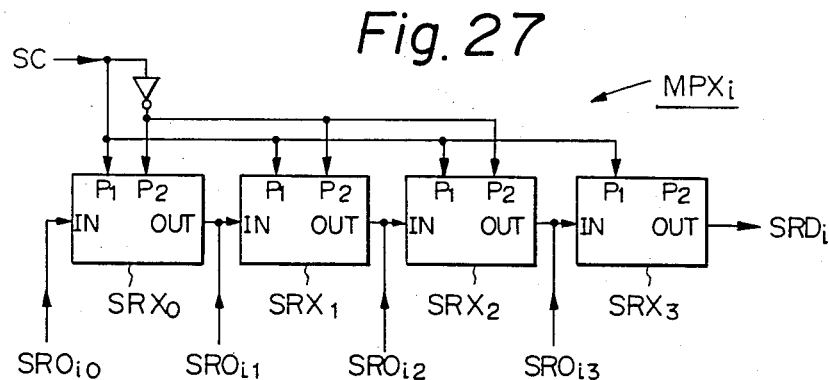
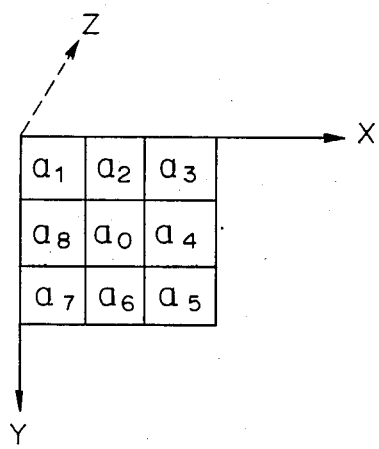
Fig. 30

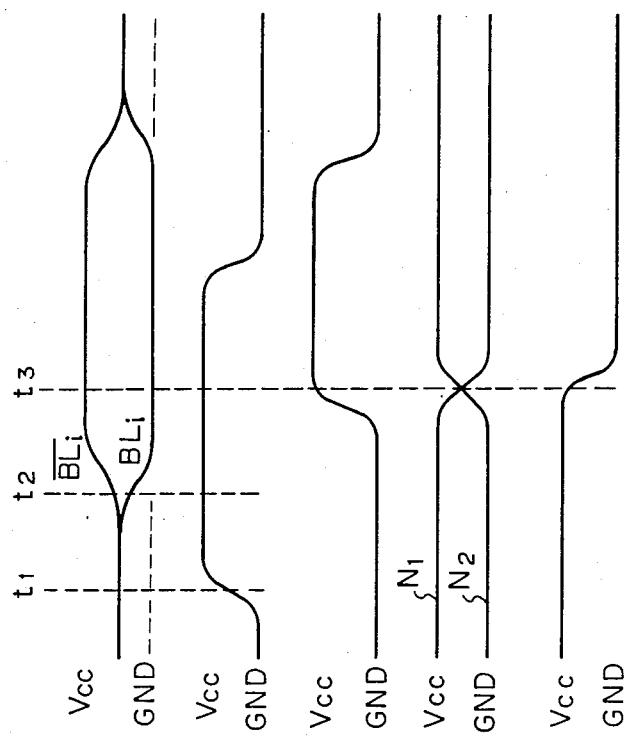

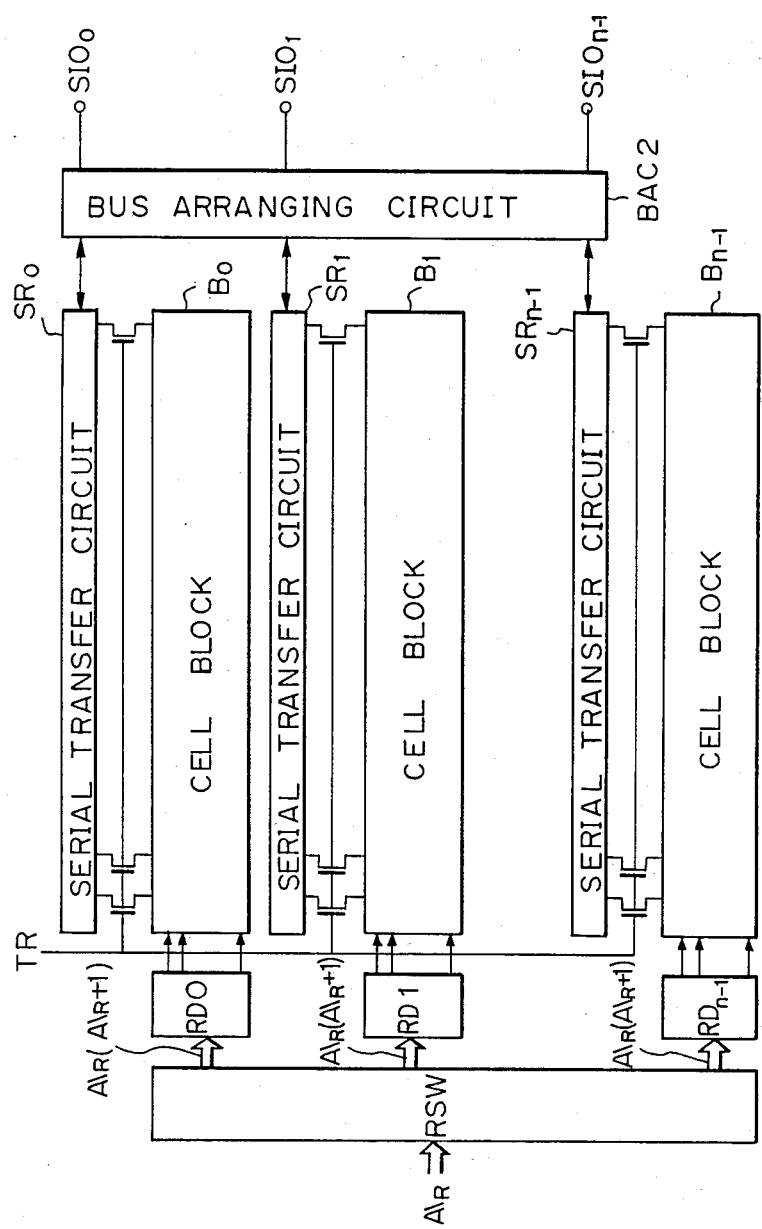

BOUNDARY-FREE SEMICONDUCTOR MEMORY DEVICE

BACKGROUND OF THE INVENTION (1) Field of the Invention

The present invention relates to a boundary-free semiconductor memory device suitable for use in a multi-dimensional data processing such as video data processing.

(2) Description of the Related Art

In video data processing or the like, a video memory device is used for storing video data. Such a device often stores video data in correspondence with pictures displayed in a graphic display or the like. For video data between adjacent addresses stored in such a device, data processings or dust removing processing such as compression processing, difference processing, smoothing processing, and the like are often carried out. For such processings, in addition to the access to a desired memory cell, it is necessary to access data of memory cells in the periphery of the desired memory cell. Therefore, in a video memory or the like, a prompt access to memory cells in the periphery of a desired memory cell, as well as the memory cell per se, is required.

Also, the above-mentioned requirement is applied to a processing for accessing every word unit such as a matrix calculation, a three-dimensional data processing, as well as a processing for accessing every memory cell unit. If a function for promptly reading stored data of adjacent addresses is provided, the efficiency of these processings is improved.

There is known a semiconductor memory device in which it is possible to access memory cells in the periphery of a desired memory cell as well as the memory cell per se (see: Japanese Unexamined Patent Publication (Kokai) No. 59-180324). In this device, however, address boundaries exist, which will be later explained in detail.

There is also known an address boundary-free semiconductor memory device in which there are no address boundaries (see: Japanese Unexamined Patent Publication (Kokai) No. 59-180324). In this device, however, only the columns adjacent to the same word line can be read. In a video processing, data of a two-dimensional spread is often required. In this case, a complex operation is required, which will be also explained in detail.

There is further known an address boundary-free semiconductor memory device, in which memory cells connected to word lines adjacent to an accessed memory cell are also simultaneously and parallelly accessed (see: Japanese Unexamined Patent Publication (Kokai) No. 61-58058). In this device, however, it is extremely difficult to enlarge an accessed group of bits. Also, this device is disadvantageous from the aspects of capacity and integration, which will be later explained in detail.

SUMMARY OF THE INVENTION

Therefore, an object of the present invention is to provide a boundary-free semiconductor memory device with which it is easy to reduce and enlarge an accessed bit group, and there is no reduction of the high capacity and the high integration of the device.

Another object of the present invention is to provide a boundary-free semiconductor memory device in which a voluntary adjacent n-row bit group can be accessed in a serial access mode.

According to the present invention, memory cells are divided into n rows×m columns of memory cell blocks. n number of the same row selecting means are provided commonly for each row of the memory cell blocks, and m number of the same column selecting means are provided commonly for each column of the memory cell blocks. Also, a first switch means gives a row address $\vec{A}_R$ or a row address $\vec{A}_R + 1$ next to said row address, to the row selecting means, and a second switch means gives a column address $\vec{A}_C$ or a column address $\vec{A}_C + 1$ next to said column address, to the column selecting means. In addition, an arranging means rearranges n×m cells of each of the memory cell blocks selected by the row selecting means and the column selecting means. Thus, it is possible to access a desired rectangular group of bits. Note that, $\vec{A}_R$ is a vector denotation of a decimal address formed by upper $(k-\log_2 n)$ bits of all the bits k of a row address except for the lower $(\log_2 n)$ bits supplied from the exterior, and $\vec{A}_C$ is a vector denotation of a decimal address formed by upper $(k-\log_2 m)$ bits of all the bits of a row address except for the lower $(\log_2 m)$ bits supplied from the exterior.

In the present invention, the row selecting means (row decoders) and the column selecting means (column decoders) are both constructed by a well known circuit technology. Also, when arranging n×m cells, the arranging means makes it possible to access an n'×m' bits group (n'<n, m'<m) by ignoring a part thereof. That is, the reduction and enlargement of a bit group is possible.

Also, in the present invention, memory cells are divided into n-row memory cell blocks, and n serial transfer means are provided in parallel with the row direction of each of the memory cell blocks. Also, n-row selecting means of the same type are commonly provided for each row of the memory cell blocks, and a switching means gives a row address $\vec{A}_R$ or a row address $\vec{A}_R + 1$ next to said row address to each of the row selecting means. In a serial access mode, a batch transfer means connects one row of each of the memory cell blocks accessed by each of the row selecting means to the respective serial transfer means, and an arranging means rearranges and connects each of the serial transfer means to n serial input/output terminals, and thus voluntary n row group bits can be accessed. That is, in a serial access mode, n rows such as four rows adjacent to a voluntary position of the logic bit map plane, are accessed in the sequence of the adjacent row data by the arranging means.

BRIEF DESCRIPTION OF THE DRAWINGS

The present invention will be more clearly understood from the description as set forth below constrasting the present invention with the related art, with reference to the accompanying drawings, wherein:

FIG. 4 is a diagram illustrating a bit map configuration according to the present invention;

FIGS. 7A and 7B are detailed circuit diagrams of the device of FIG. 6;

FIG. 11 is a detailed circuit diagram of the selector of FIG. 9;

FIG. 12 is a detailed circuit diagram of the row-side switch (column-side switch) of FIG. 7;

FIG. 13 is a diagram explaining a row boundary-free chip;

FIGS. 14A, 14B and 14C are diagrams showing data of the accessed cell blocks of FIG. 7;

FIGS. 17A to 17C are diagrams explaining the location of the pointing bit;

FIGS. 22A to 22C are detailed circuit diagrams of the device of FIG. 21;

FIGS. 25A to 25C are timing diagrams showing the operation of the circuit of FIG. 24A;

FIGS. 26A to 26E are timing diagrams showing the operation of a batch parallel transfer of FIG. 23;

FIG. 27 is a detailed circuit diagram of the multiplexer of FIG. 22;

FIG. 30 is a diagram explaining a video picture processing; and

FIG. 31 is a circuit diagram illustrating a third embodiment of the boundary-free semiconductor memory device according to the present invention.

DESCRIPTION OF THE PREFERRED EMBODIMENTS

First, the prior art semiconductor memory devices will be explained with reference to FIGS. 1 to 3.

Figure 1:
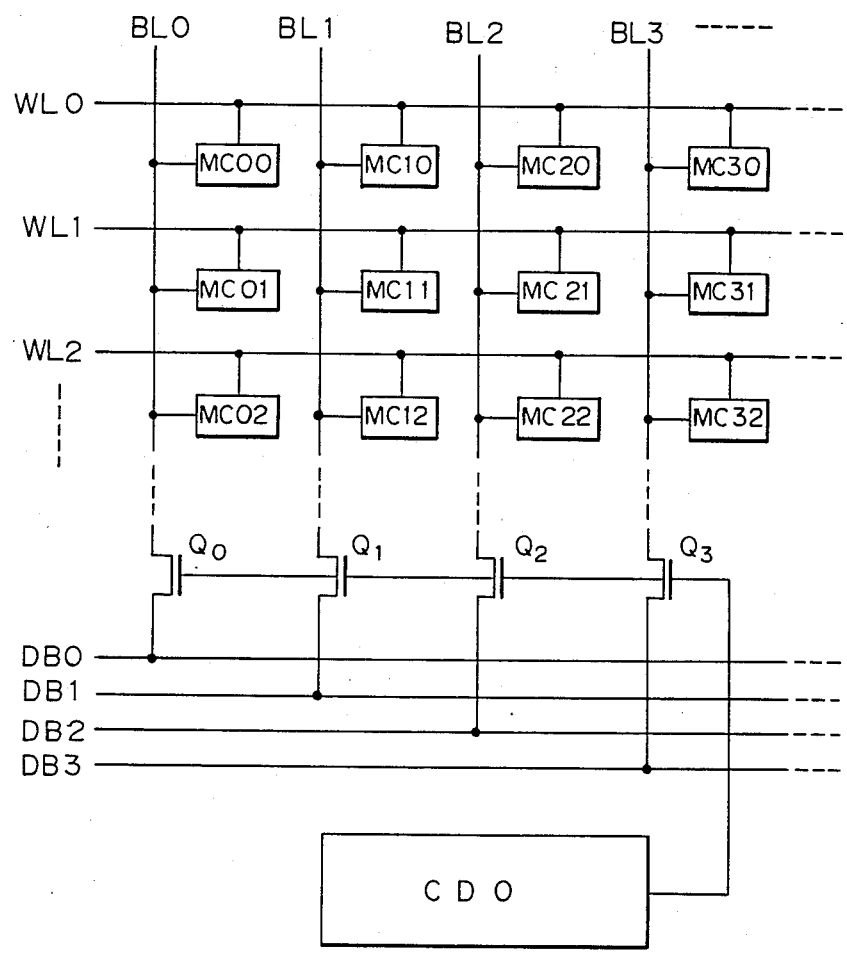
FIGS. 1, 2, and 3 are circuit diagrams illustrating a prior art semiconductor memory device.

In FIG. 1, which illustrates a prior art semiconductor memory device, it is possible to access memory cells in the periphery of a desired memory cell as well as the memory cell per se, but address boundaries exist (see: FIG. 2 of Japanese Unexamined Patent Publication (Kokai) No. 59-180324). That is, memory cells MC00, MC01, MC02, . . . , and MC10, MC11, . . . are provided between word lines WL0, WL1, WL2, . . . and bit lines BL0, BL1, BL2, BL3, . . . Also, transfer transistors $Q_0$, $Q_1$, $Q_2$, $Q_3$, . . . are provided between the bit lines BL0, BL1, BL2, BL3, . . . and data buses DB0, DB1, DB2, DB3. Further, a column decoder CD0 is provided for commonly controlling the transistors $Q_0$ to $Q_3$.

In the device of FIG. 1, when one word line such as WL1 is selected and a column selection signal is applied from the column decoder CD0 to the transistors $Q_0$, $Q_1$, $Q_2$, and $Q_3$, the four memory cells MC01, MC11, MC21, and MC31 connected to the word line WL1 are accessed and, for example, the data thereof can be simultaneously read. That is, in the device of FIG. 1, a parallel read is possible, i.e., four bits of data can be read by indicating one address.

In FIG. 1, however, a parallel read operation is defined to memory cells connected to a predetermined group of bit lines, and it is impossible to simultaneously read memory cells connected to bit lines belonging to different groups. As a result, if a desired memory cell such as MC31 is located on the edge of a data group, it is impossible to read memory cells on both sides of the desired memory cell. That is, an address boundary exists.

For this purpose, there has already been suggested a semiconductor memory device having no address boundaries, i.e., an address boundary-free semiconductor memory device (see: Japanese Unexamined Patent Publication (Kokai) Nos. 59-180324 and 61-58058). Such as a semiconductor memory device will be explained with reference to FIGS. 2 and 3.

Figure 2:
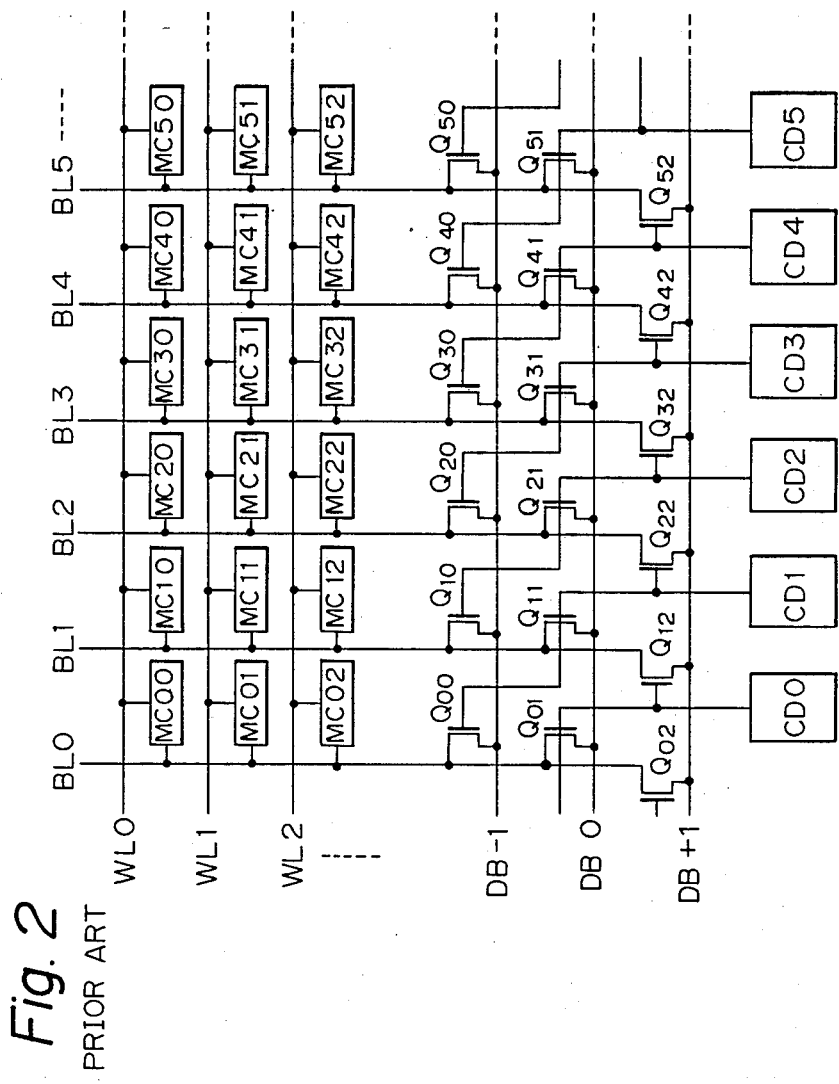

In FIG. 2, which is a block circuit diagram of a prior art boundary-free semiconductor memory device (see: Japanese Unexamined Patent Publication (Kokai) No. 59-180324), there are provided word lines WL0, WL1, WL2, . . . ; bit lines BL0, BL1, BL2; memory cells MC00, MC01, MC02, . . . ; MC10, MC11, MC12, . . . ; three data buses DB−1, DB0, and DB+1; column decoders CD0, CD1, CD2, . . . ; and transfer transistors $Q_{00}$, $Q_{01}$, $Q_{02}$; $Q_{10}$, $Q_{11}$, $Q_{12}$; . . . The transfer transistors $Q_{00}$, $Q_{01}$, and $Q_{02}$ are connected between the bit line BL0 and the data buses DB−1, DB0, and DB+1, the transfer transistors $Q_{10}$, $Q_{11}$, and $Q_{12}$ are connected between the bit line BL1 and the data buses DB−1, DB0, and DB+1. This holds true for other transfer transistors. Also, each of the column decoders CD0, CD1, CD2, . . . is connected to a gate of a transfer transistor connected between one bit line and the data bus DB0, and to gates of transfer transistors connected between the adjacent bit lines and the data buses DB−1 and DB+1. For example, the column decoder CD1 is connected to the gate of the transfer transistor $Q_{11}$ connected between bit line BL1 and the data bus DB0, to the gate of the transfer transistor $Q_{00}$ connected between the bit line BL0 and the data bus DB−1, and to the gate of the transfer transistor $Q_{22}$ connected between the bit line BL2 and the data bus DB+1. Note that each of the memory cells MC00, MC01, . . . is a one-transistor, one-capacitor type which comprises a capacitor and a transfer transistor for connecting said capacitor to the respective bit line, the transfer transistor being controlled by the potential at the respective word line.

In the device of FIG. 2, when a word line such as WL1 is selected so that the potential thereof is increased, the capacitors of the memory cells MC01, MC11, MC21, MC31, . . . are connected to the respective bit lines BL0, BL1, BL2, BL3, . . . In addition, if the memory cell MC11 is one memory cell indicated by the addresses, the transfer transistor $Q_{00}$ and $Q_{22}$ as well as the transistor $Q_{11}$ are turned ON by the column selection signal from the column decoder CD1. As a result, in a read mode, the data of the memory cell MC11 is output via the bit line BL1, the transfer transistor $Q_{11}$, and the data bus DB0. In addition, the data of the memory cells MC01 and MC21 adjacent to the memory cell MC11 are output via the bit lines BL0 and BL2, the transfer transistors $Q_{00}$ and $Q_{22}$, and the data buses DB−1 and DB+1. Therefore, when the memory cell MC11 is indicated by the addresses, the memory cells MC01 and MC21 adjacent to the memory cell MC11 can be also simultaneously accessed, for example, can be read out.

In the device of FIG. 2, however, only the columns adjacent to the same word line can be read. In video processing, data of a two-dimensional area is often required. For example, when a 3 rows×3 columns area (MC00, MC10, MC20), (MC01, MC11, MC21), (MC02, MC12, MC22) at the center of the memory cell MC11 is simultaneously required, three selection operations, i.e., the selection of the word line WL0 and the column decoder CD1, the selection of the word line WL1 and the column decoder CD1, and the selection of the word line WL2 and the column decoder CD1 must be carried out, which complicates the memory access, and does not sufficiently reduce the access time.

Figure 3:
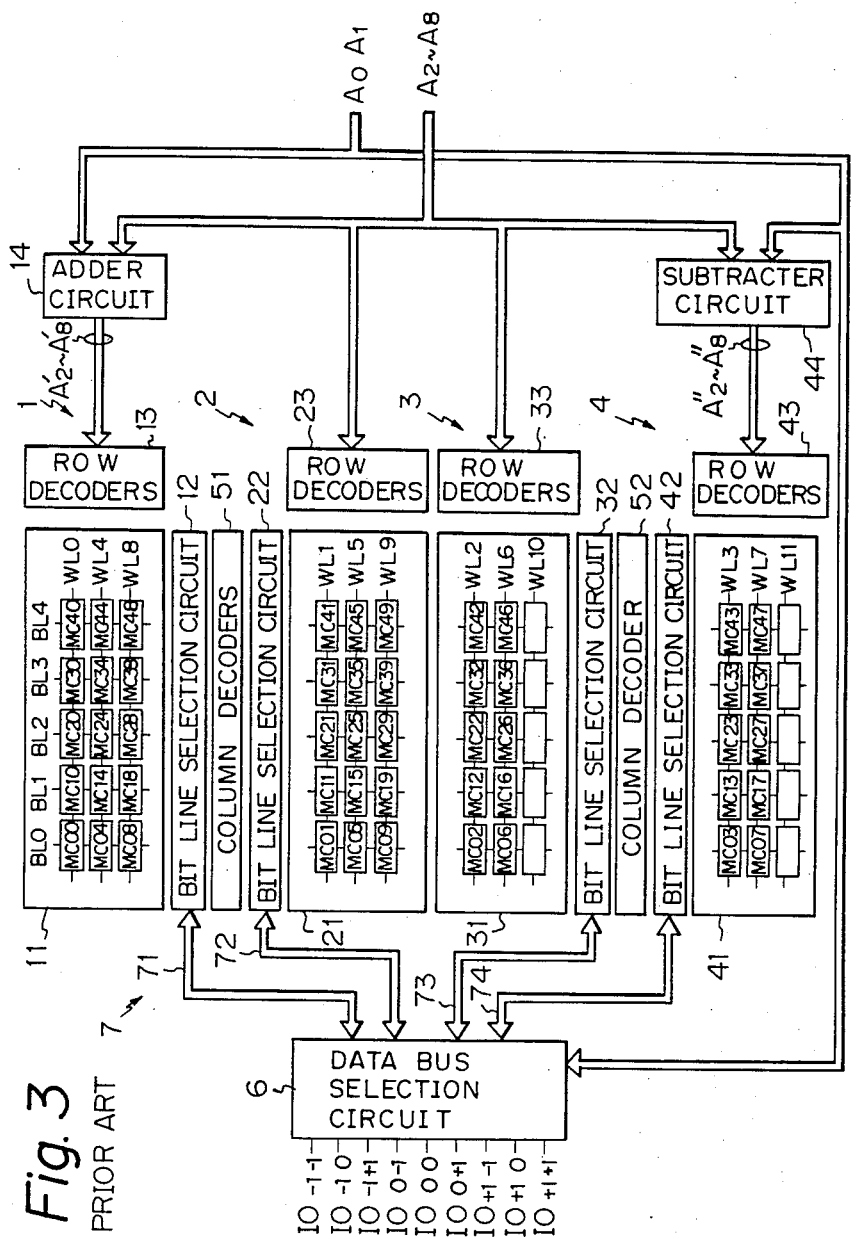

In FIG. 3, which also illustrates a prior art boundary-free semiconductor memory device, memory cells connected to word lines adjacent to an accessed memory cell are also simultaneously and parallelly accessed. In FIG. 3, the entire chip is divided into four blocks 1, 2, 3, and 4. Reference numeral 6 designates a data bus selection circuit, and 7 a data bus. The block 1 is comprised of a cell block 11 formed by memory cells MC00 to MC40, MC04 to MC44, MC08 to MC48 connected between data lines BL0 to BL4 and word lines WL0, WL4, and WL8, and a bit line selection circuit 12 in which transfer transistors are connected in the same way as in FIG. 2, a row decoder 13, and an adder circuit 14 thereof. This holds true for the blocks 2, 3, and 4, except that the adder circuit 14 is not provided in the blocks 2 and 3, and a subtracter circuit 44 instead of the adder circuit 14 is provided in the block 4. Also, column decoders 51 and 52 are connected to the blocks 1 and 2, and the blocks 3 and 4, respectively. The bit line selection circuits 12, 22, 32, and 42 of the blocks 1, 2, 3, and 4 are connected via data buses 71 to 74 to a data bus selection circuit 6.

Here, a random access operation will be considered. The blocks 1, 2, 3, and 4 operate in parallel by receiving row address signals $A_2$ to $A_8$, and the block is determined by the data bus selection by the data bus selection circuit 6 by the data bus selection circuit 6 by the lower two bits $A_0$ and $A_1$ of the row address signals. Therefore, when the row address signals $A_0$ to $A_8$ are counted up from 0, one by one, the word lines WL0, WL1, . . . , and $WL_n$ are sequentially selected. In this case, in the cell block 11, the word lines WL0, WL4, WL8, . . . in this sequence are selected; in the cell block 21, the word lines WL1, WL5, WL9, . . . in this sequence are selected; in the cell block 31, the word lines WL2, WL6, WL10, . . . in this sequence are selected; and in the cell block 41, the word lines WL3, WL7, WL11 in this sequence are selected. In view of an address sequence, 4 is separated within each block, and adjacent word lines such as WL0 and WL1, WL1 and WL2 belong to different and adjacent blocks. In addition, within each block, a word line indicated by an adjacent row address is selected and is simultaneously operated. Therefore, when data output to memory cells of a selected word line is performed upon each block, memory cells of adjacent row address can be parallelly accessed. However, when a center row address by a random access indicates a word line of the end block 1 or 4, a word line corresponding to a row address immediately before this row address or a row address next thereto is in a non-selection state. That is, even when access to the blocks is parallelly carried out, it is impossible to access data of word lines relating to a specified address in dependence upon a row address. Therefore, in a mode for simultaneously accessing memory cells on adjacent word lines, a technique is introduced to cycle the sequence of selection of word lines regarding the end blocks.

In FIG. 3, the memory cells are 256 Kbits, and the 9-bit address signals $A_0$ to $A_8$ ($A_0$ is a least significant bit (LSB), $A_8$ is a most significant bit (MSB)) are connected to the decoder circuits 13, 23, 33, and 43 to indicate an address of the above-mentioned memory cell. Note that, only the bits $A_2$ to $A_8$ are connected to the decoder circuits 23 and 33, the bits $A'_2$ to $A'_8$ processed by the adder circuit 14 are applied to the decoder circuit 13, and the bits $A''_2$ to $A''_8$ processed by the subtracter circuit 44 are applied to the decoder circuit 44. Also, the bits $A_0$ and $A_1$ are applied to the data bus selection circuit 6.

In the device of FIG. 3, the adder circuit and the subtracter circuit is provided on the row side, and the special decoders are provided on the column side, thereby forming a 3 rows×3 columns bit group, however, it is extremely difficult to enlarge this bit group to a 4 rows×4 columns or 5 rows×5 columns bit group. Also, the column decoders must be located at a pitch of the bit lines, i.e., at a pitch of a minimum dimension of a transistor, thereby increasing the length of the column decoders on the bit line direction, and thus reducing the large capacity and high integration thereof. Also, since the column decoders are located at a pitch of the bit lines, the bit lines and the connections for the three transfer transistors are located at a pitch of the bit lines, thus requiring a high-level multi-board connection technology without reducing the high integration of the memory cell array, which is disadvantageous in a high capacity and high integration device.

A boundary-free chip is explained with reference to FIG. 4. In FIG. 4, a bit map configuration of 1 Mbits memory cell array MCA is shown. That is, 1024 memory cells are arranged along the X-direction, and 1024 memory cells are arranged along the Y-direction. In this case, a selection of one row is carried out by 10 bits of row addresses RA0 to RA9, and a selection of one column is carried out. Here, it is considered that a rectangular bit group of 4×4 bits are simultaneously accessed. In this case, when a pointing bit PB is indicated and accessed on the bit map, peripheral bits (surrounded by a thick line) are also accessed. In any bit on the bit map can be such a pointing bit PB, there is no boundary within a chip, which means that this chip is a boundary-free memory device.

Figure 5A:
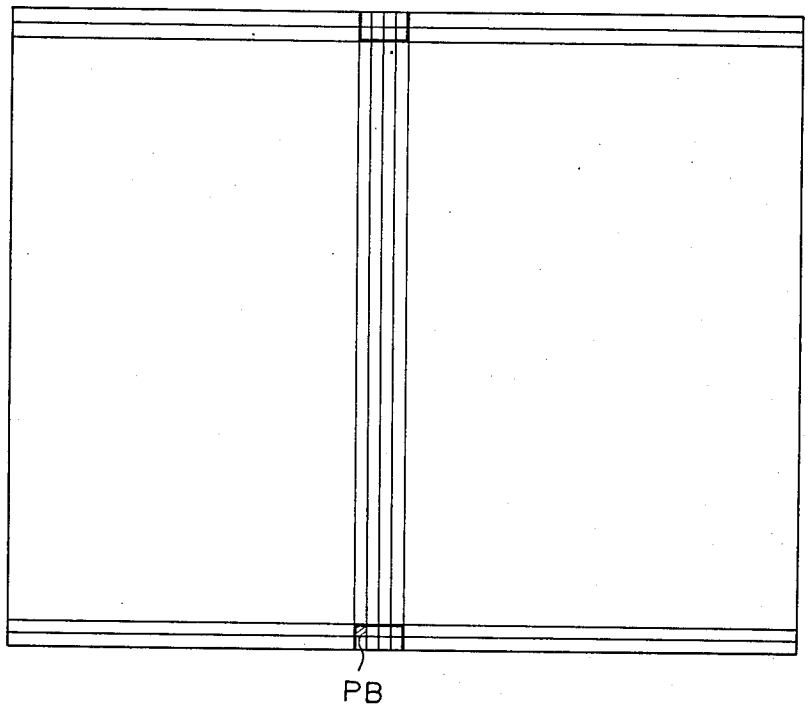
FIGS. 5A to 5C are diagrams explaining boundary-free chips.
Figure 5B:
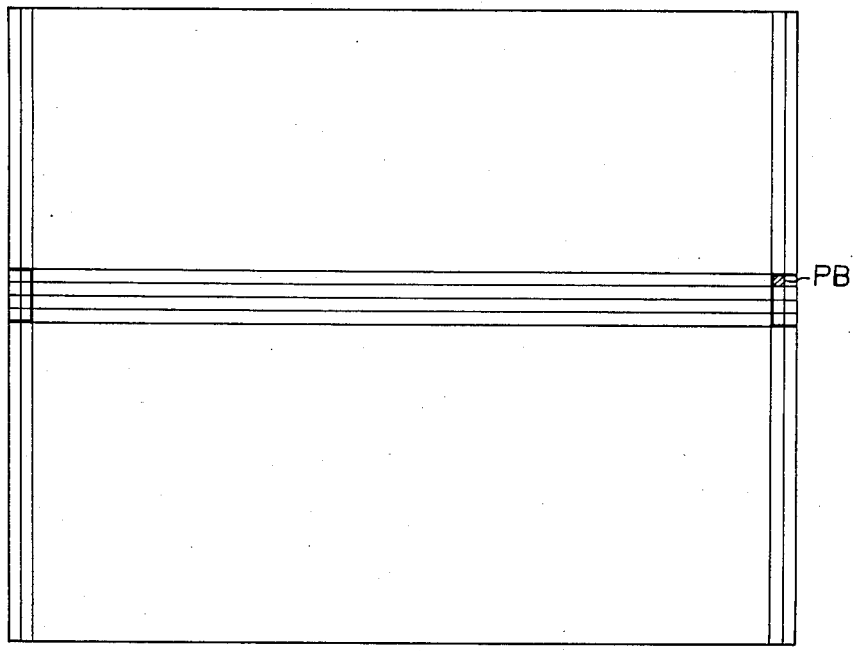
Figure 5C:
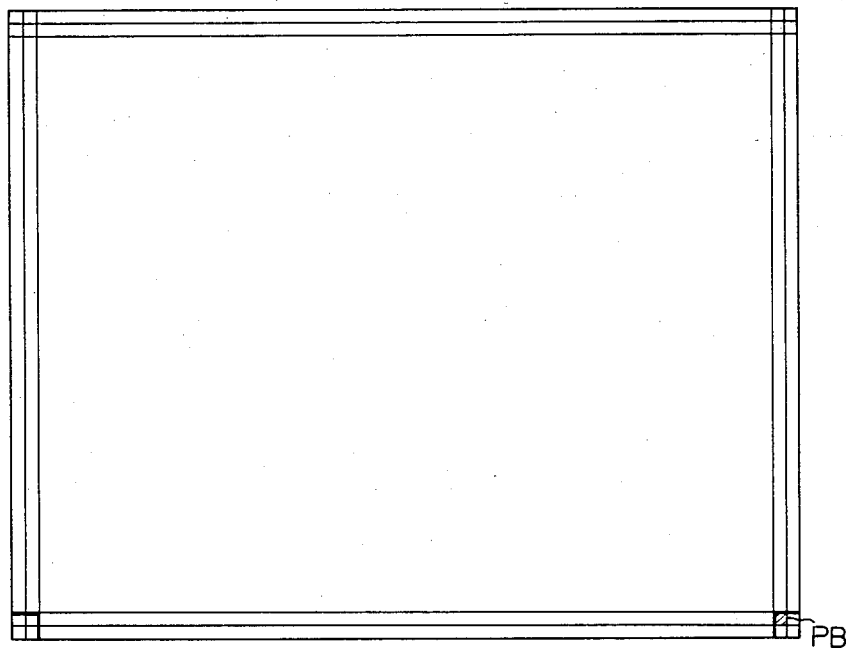

Also, when the pointing bit PB approaches the boundary of the chip, there is a chip boundary. In order to eliminate such a chip boundary, the boundary is cycled. For example, as illustrated in FIG. 5A, when the boundary of an accessed bit group exceeds a row boundary of the chip, a region of small row addresses is simultaneously accessed. Also, as illustrated in FIG. 5B, when the boundary of an accessed bit group exceeds a column boundary of the chip, a region of small column addresses is simultaneously accessed. Further, as illustrated in FIG. 5C, when the boundary of an accessed bit group exceeds both the row boundary and the column boundary, a region of small row addresses and small column addresses is simultaneously accessed. Thus, a chip boundary-free semiconductor memory device is obtained.

The present invention relates to a semiconductor memory device free from address boundaries within the chip and free from chip boundaries.

Figure 6:
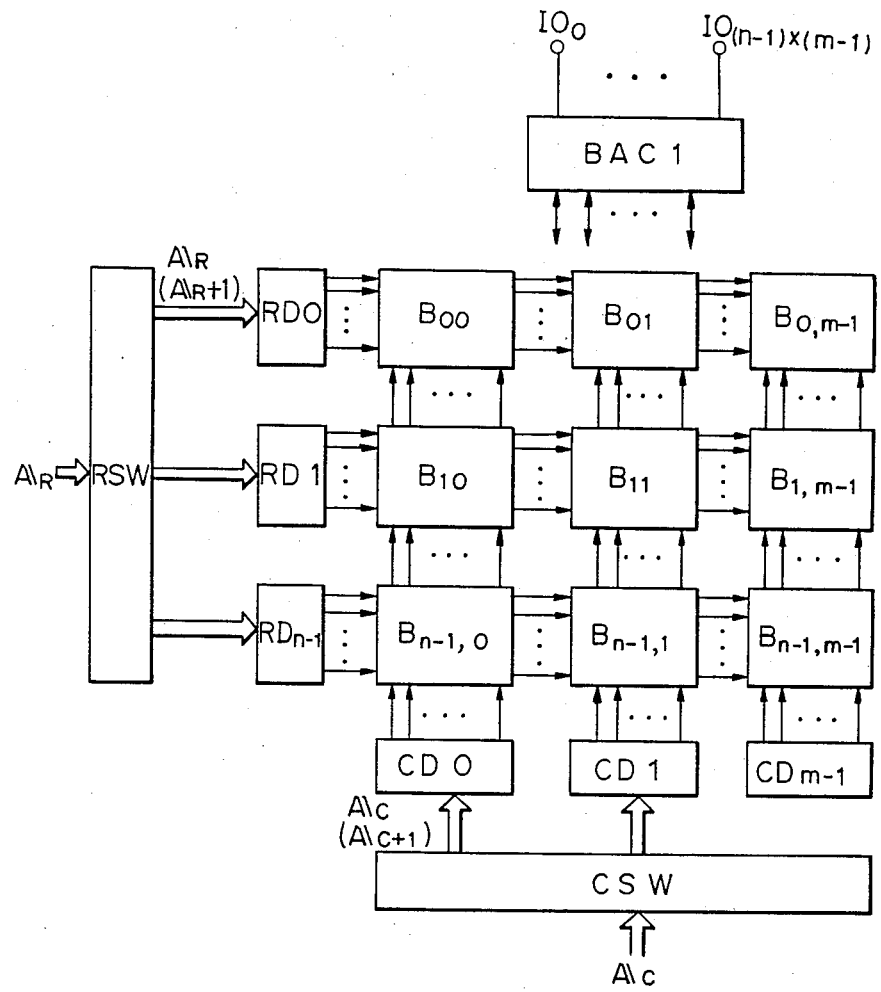
FIG. 6 is a circuit diagram illustrating a first embodiment of the boundary-free semiconductor memory device according to the present invention.

In FIG. 6, which illustrates a first embodiment of the boundary-free semiconductor memory device, memory cells are divided into n rows x m columns of memory cell blocks $B_{00}$, $B_{01}$, ..., $B_{0n-1}$; $B_{10}$, $B_{11}$, ..., $B_{1,m-1}$; $B_{n-1,0}$, $B_{n-1,1}$, ..., $B_{n-1,m-1}$. n number of same row selecting circuits $RD_0$, $RD_1$, ..., and $RD_{n-1}$ are provided commonly for each row of the memory cell blocks, and m number of same column selecting means $CD_0$, $CD_1$, ..., and $CD_{m-1}$ are provided commonly for each column of the memory cell blocks. Also, a first switch circuit RSW gives a row address $A_R$ or a row address $A_R + 1$ next to said row address to the row selecting circuits, and a second switch circuit CSW gives a column address $A_C$ or a column address $A_C + 1$ next to said column address to the column selecting circuits. In addition, an arranging circuit BAC1 rearranges n×m cells of each of the memory cell blocks selected by the row selecting circuits $RD_0$, $RD_1$, ..., and $RD_{n-1}$ and the column selecting circuits $CD_0$, $CD_1$, ..., and $CD_{m-1}$, thus it is possible to access a desired rectangular bit group.

Figure 7B:
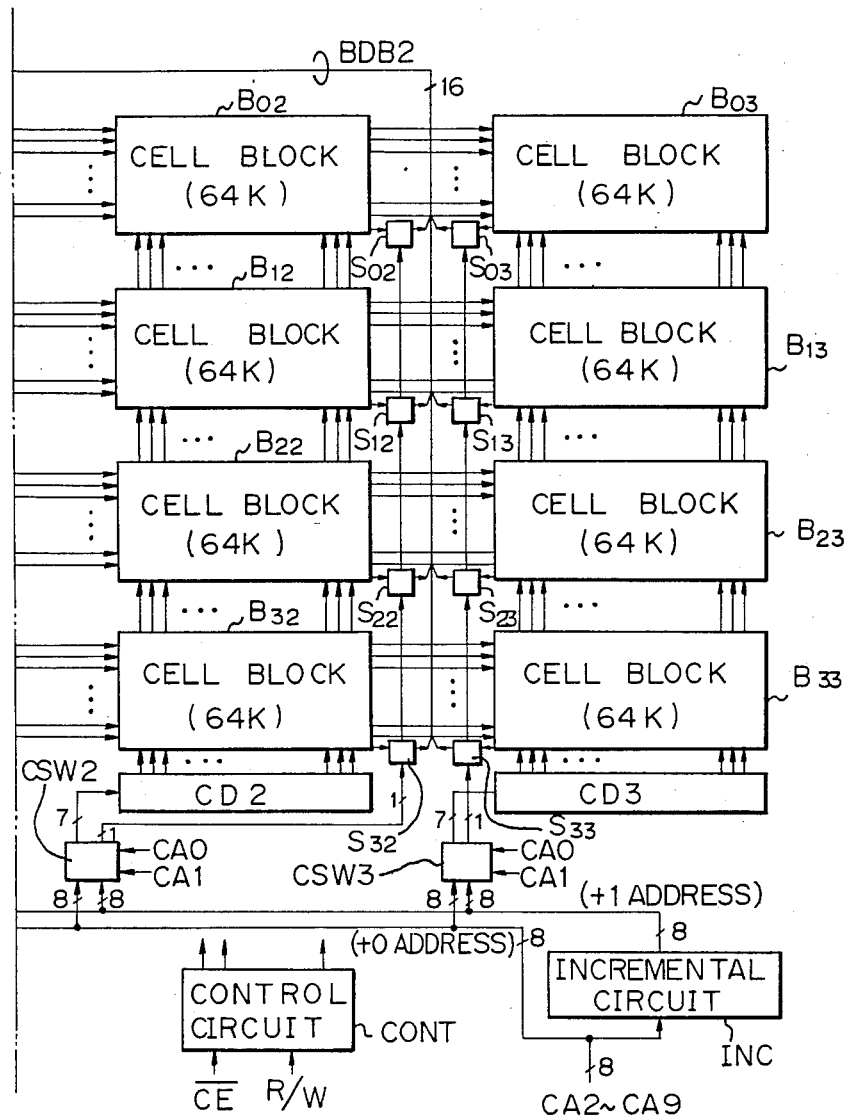
Figure 8:
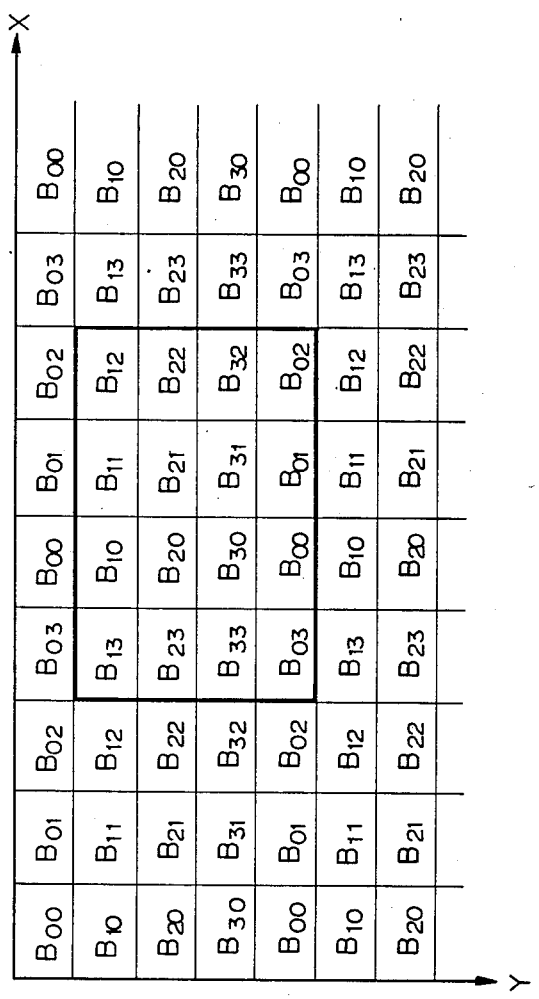
FIG. 8 is a diagram showing an allocation of a bit map to memory cell blocks according to the present invention.

The first embodiment of FIG. 6 will be explained in more detail with reference to FIG. 7. In FIG. 7, 1 M (1048576) bit memory cells are divided into 16 cell blocks $B_{00}$, $B_{01}$, ..., and $B_{33}$. That is, each of the cell blocks $B_{00}$, $B_{01}$, ..., and $B_{33}$ is 64K (65536) bits. Here, the bit map (see FIG. 4) of the memory cells is allocated to the blocks as illustrated in FIG. 8.

A row decoder $RD_0$ is provided commonly for the four cell blocks $B_{00}$, $B_{01}$, $B_{02}$, and $B_{03}$; a row decoder $RD_1$ is provided commonly for the four cell blocks $B_{10}$, $B_{11}$, $B_{12}$, and $B_{13}$; a row decoder $RD_2$ is provided commonly the four cell blocks $B_{20}$, $B_{21}$, $B_{22}$, and $B_{23}$; and a row decoder $RD_3$ is provided commonly for the four cell blocks $B_{30}$, $B_{31}$, $B_{32}$, and $B_{33}$. These row decoders $RD_0$ to $RD_3$ have the same configuration. On the other hand, a column decoder $CD_0$ is provided commonly for the four cell blocks $B_{00}$, $B_{10}$, $B_{20}$, and $B_{30}$; a row decoder $CD_1$ is provided commonly for the four cell blocks $B_{01}$, $B_{11}$, $B_{21}$, and $B_{31}$; a row decoder $RD_2$ is provided commonly for the four cell blocks $B_{02}$, $B_{12}$, $B_{22}$, and $B_{32}$; and a row decoder $CD_3$ is provided commonly for the four cell blocks $B_{03}$, $B_{13}$, $B_{23}$, and $B_{33}$. These column decoders $CD_0$ to $CD_3$ also have the same configuration.

Among the ten-bit row address signals RA0 to RA9, the upper 8 bits RA2 to RA9 are incremented by +1 (decimal denotation) by an incrementer circuit INR, and as a result, two addresses, i.e., +0 address (through state) and +1 address (incremental state) are supplied to row-side switches RSW0 to RSW3. The row-side switches RSW0 to RSW3 switch the +0 address and the +1 address in accordance with the lower two bits RA0 and RA1 of the ten-bit row address signals, and supply then to the row decoders $RD_0$ to $RD_3$. On the other hand, among the ten-bit column address signals CA0 to CA9, the upper 8 bits CA2 to CA9 are incremented by +1 (decimal denotation) by an incremental circuit INC, and as a result, two addresses, i.e., +0 address (through state) and +1 address (incremental state) are supplied to column-side switches CSW0 to CSW3. The column-side switches CSW0 to CSW3 switch the +0 address and the +1 address in accordance with the lower two bits CA0 and CA1 of the ten-bit row address signals, and supply them to the column decoders CD0 to CD3. In this case, however, as will be explained later, since two bit lines are selected in each of the cell blocks, one-bit outputs of the column-side switches CSW0 to CSW3 are transmitted to selectors $S_{00}$, $S_{10}$, $S_{20}$, and $S_{30}$; ...; $S_{30}$, $S_{31}$, $S_{32}$, and $S_{33}$.

The sixteen selectors $S_{00}$, $S_{10}$, $S_{20}$, and $S_{30}$; ...; $S_{30}$, $S_{31}$, $S_{32}$, and $S_{33}$ are connected by block data buses BDB1 and BDB2 to a bus arranging circuit BAC1. Note that the bus BDB1 includes sixteen lines for signals $BDB_{00}$ to $BDB_{03}$, $BDB_{10}$ to $BDB_{13}$, and their inverted signals, and the bus BDB2 includes sixteen lines for signals $BDB_{20}$ to $BDB_{23}$, $BDB_{30}$ to $BDB_{33}$, and their inverted signals. The bus arranging circuit BAC1 controls the connections between the selector $S_{00}$ to $S_{33}$ and input/output terminals $IO_0$ to $IO_{15}$ in accordance with the lower bits RA0, RA1, CA0, and CA1.

Also, a control circuit CONT controls various portions in accordance with a chip enable $\overline{CE}$, a read/write signal R/W, and the like.

Figure 9:
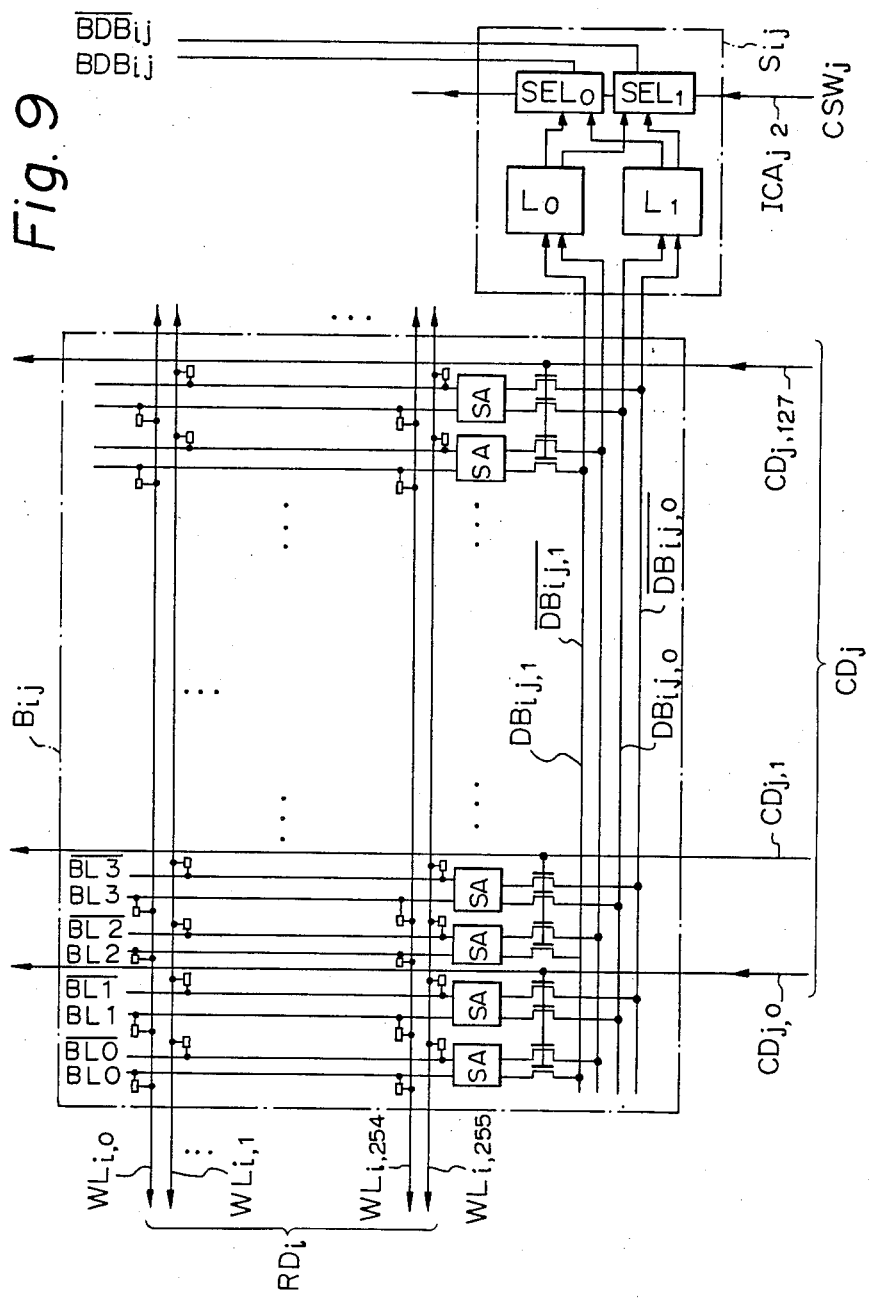
FIG. 9 is a detailed circuit diagram of the cell block of FIG. 7.
Figure 10:
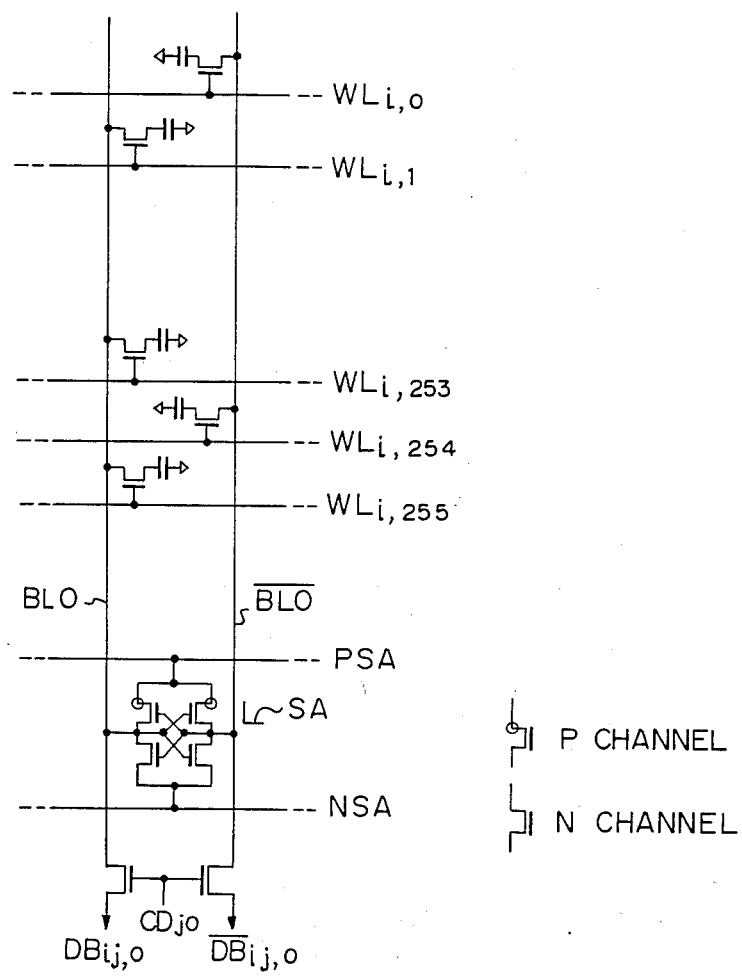
FIG. 10 is a partial detailed diagram of FIG. 9.

In FIG. 9, which is a detailed circuit diagram of the cell block $B_{ij}$, folded bit lines are used. That is, as illustrated in FIG. 10, memory cells are provided at every other intersection of a pair of bit lines and word lines on one side of each sense amplifier SA. Note that the sense amplifier SA of FIG. 10 is comprised of P-channel transistors between a line PSA and bit lines BL0 and $\overline{BL0}$, and N-channel transistors between a line NSA and bit lines BL0 and $\overline{BL0}$, and when the lines PSA and NSA are made high and low, respectively, the sense amplifier SA is operated. Also, in FIG. 9, the row decoder $RD_i$ selects one word line from 256 word lines $WL_{i,0}$, $WL_{i,1}$, ..., and $WL_{i,225}$, while the column decoder $CD_j$ selects two pairs of bit lines such as BL0 and $\overline{BL0}$; and BL1 and $\overline{BL1}$ by the column selection signals $CD_{j,0}$, $CD_{j,1}$, ..., and $CD_{j,127}$ thereof, and connects them to data buses $DB_{ij,0}$ and $\overline{DB_{ij,0}}$; $DB_{ij,1}$ and $\overline{DB_{ij,1}}$ within the block, and further, one pair of the two pairs of the data buses $DB_{ij,0}$ and $\overline{DB_{ij,0}}$; $DB_{ij,1}$ and $\overline{DB_{ij,1}}$ within the block is selected by a switch $S_{ij}$ and is connected to block data buses $BDB_{ij}$ and $\overline{BDB_{ij}}$.

The switch $S_{ij}$ is comprised of two data bus latches L0 and L1 and two selectors SEL0 and SEL1. As illustrated in FIG. 11, each of the selectors is comprised of an inverter I, AND circuits $G_1$ and $G_2$, and an OR circuit $G_3$. That is, in accordance with a bit $CSW_j$ of a column address, one of the data bus latches L0 and L1 is connected to the block data buses $BDB_{ij}$ and $\overline{BDB_{ij}}$.

According to the configuration of the cell block $B_{ij}$ as shown in FIG. 6, since each of the column decoders $CD_j$ has a 128-bit configuration, this contributes to a reduction of the column decoders, which is helpful in maintaining a large capacity and high integration of a device. However, in the present invention, such a cell block configuration is only one example. That is, the present invention can be applied to an open bit line type. Also, each of the column decoder $CD_j$ is constructed to be able to directly select one bit line pair from 256 pairs of bit lines. In this case, all the 8 bit addresses from the column-side switches CSW0 to CSW3 are supplied to all the respective column decoders $CD_j$, and the switch $S_{ij}$ is deleted.

In FIG. 7, when a 4×4 bit group (see FIG. 4) as indicated by a thick line frame in FIG. 8 is accessed, in order to locate the pointing bit in a left and upper edge point, the X coordinate of the bit map is (CA9, CA8, ..., CA0)=(0000000011)

Also, the Y coordinate of the bit map is (RA9) RA8, ..., RA0)=(0000000001)

These coordinates are supplied from the exterior. That is, if the upper 16 bits (RA9 to RA2, CA9 to CA2) of an address given to each of the cell blocks are the same, a boundary-free 4×4 bit group indicated by a thick line frame in FIG. 8 is present in a logic plane. At this time, in order to always access four bits having X coordinate values (column) larger than that of the pointing bit PB and four bits having Y coordinate (row) values larger than that of the pointing bit PB, the upper 16 bits input to the row decoders RD0 to RD3 and the column decoders CD0 to CD3 are switched by the cases of +0 (through state) or +1 (incremental state). Thus, the address boundary indicated by a thick line in FIG. 8 is erased.

In each cell block $B_{ij}$, the above-mentioned switching of the cases of +0 (through) and +1 (through) must be carried out. However, since one row decoder such as RD0 is provided commonly for four cell blocks such as $B_{00}$, $B_{01}$, $B_{02}$, and $B_{03}$ for one row, and one column decoder such as CD0 is provided commonly for cell blocks such as $B_{00}$, $B_{10}$, $B_{20}$, and $B_{30}$, there are only eight switches, i.e., the row-side switches RSW0 to RSW3 and the column-side switches CSW0 to CSW3.

As illustrated in FIG. 12, each of the switches RSW0 to RSW3 (or CSW0 to CSW3) is comprised of a decoder DEC1 for decoding the lower two bits RA0 and RA1 of a row address (or CA0 and CA1 of a column address), and an 8 bit selector SEL which operates in accordance with the output SWT of the decoder DEC1. Here, the decoder DEC1 has a decoding logic dependent on each of the switches, and has a circuit satisfying the logic equation as indicated in TABLE 1.

TABLE 1

| SWITCH | SWT |
|---|---|
| RSW0 | (RA0) + (RA1) |
| RSW1 | (RA1) |
| RSW2 | (RA0) · (RA1) |
| RSW3 | 0 |
| CSW0 | (CA0) + (CA1) |
| CSW1 | (CA1) |
| CSW2 | (CA0) · (CA1) |
| CSW3 | 0 |

In TABLE 1, "+" shows "OR", and "·" shows "AND".

Note that, since a bit group has the same width on the row side as the width on the column side, the logic equations of the row-side switches are the same as those of the column-side switches. However, if a bit group is comprised of 2×8 bits, 3×5 bits, ..., so that that width in the row direction is different from the width in the column direction, the logic equations of the row-side switches are naturally different from those of the column-side switches.

The logic equations of TABLE 1 are explained with reference to FIG. 13. In FIG. 13, which is a diagram showing a row address boundary, three thick lines in the traverse direction indicate row boundaries by the upper 8 bits RA9 to RA2. Here, the four blocks $B_{0j}$, $B_{1j}$, $B_{2j}$, and $B_{3j}$ have a difference in the lower two bits on the Y coordinate (row) of the bit map plane. As 4×4 bit groups are accessed, there are four kinds of cases I, II, III, and IV. In case I, since the bit group does not cross the row address boundary, the same external addresses RA9 to RA2 is supplied to the cell blocks $B_{0j}$, $B_{1j}$, $B_{2j}$, and $B_{3j}$ without changing them (through state). In case II, the row address only for the cell block $B_{0j}$ is incremented by +1. In case III, the row addresses for the cell blocks $B_{0j}$ and $B_{1j}$ are incremented by +1. In case IV, the row addresses for the cell blocks $B_{0j}$, $B_{1j}$, and $B_{2j}$ are incremented by +1. In summary, TABLE 2 is obtained.

TABLE 2

| CASE | (RA1, RA0) | $B_{3j}$ | $B_{2j}$ | $B_{1j}$ | $B_{0j}$ |
|---|---|---|---|---|---|
| I | (0, 0) | +0 | +0 | +0 | +0 |
| II | (0, 1) | +0 | +0 | +0 | +1 |
| III | (1, 0) | +0 | +0 | +1 | +1 |
| IV | (1, 1) | +0 | +1 | +1 | +1 |

TABLE 2 is transformed into logic equations by the lower two bits RA1 and RA0 indicating the pointing bit position, thus obtaining TABLE 1.

Note that the same holds true for the column address side.

Thus, a boundary-free 4×4 bit group can be accessed, for example, can be read from the bit map. However, when data is transmitted to input/output terminals $IO_0$ to $IO_{15}$, this is disadvantageous to the peripheral processing of video data. For example, when a 4×4 bit group corresponding to a block as illustrated in FIG. 14A is read without arranging, the relationship between the pointing bit (PB) and the other peripheral bits on the bit map is not a logic relationship, as illustrated in FIG. 14B. Actually, an arrangement of the input/output terminals as illustrated in FIG. 14C is desired. That is, (1) the pointing bit PB is always accessed at the input/output terminal $IO_0$;

(2) the four bits located by sequentially incrementing the pointing bit PB in the X direction are sequentially accessed at the input/output terminals $IO_0$, $IO_1$, $IO_2$, and $IO_3$; and (3) then, the Y direction is incremented, and the four bits located by incrementing the X direction are sequentially accessed at the input/output terminals $IO_4$, $IO_5$, $IO_6$, and $IO_7$.

Figure 15:
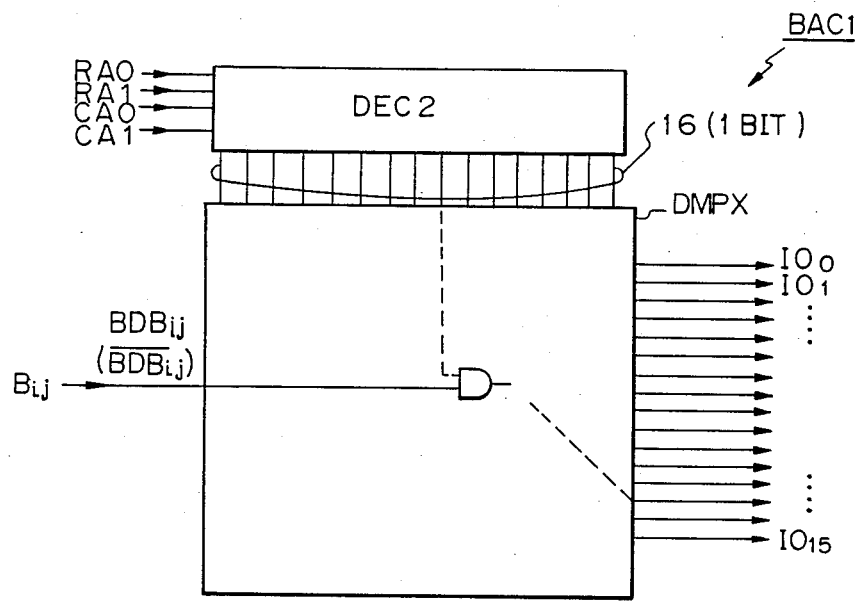
FIG. 15 is a circuit diagram of the bus arranging circuit of FIG. 7.
Figure 16:
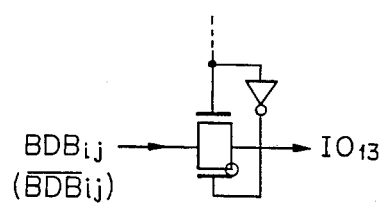
FIG. 16 is a partial circuit diagram of FIG. 15.

In order to always access a 4×4 bit group as illustrated in FIG. 14C from the bit map regardless of an address of the pointing bit PB, a bus arranging circuit BAC1 is provided. As illustrated in FIG. 15, the bus arranging circuit BAC1 is comprised of a demultiplexer circuit DMPX (actually, 16 demultiplexers) which is operated to connect the block data bus $BDB_{ij}$ $\overline{BDB_{ij}}$), connected to the cell block $B_{ij}$, to one of the input/output terminals $IO_0$ to $IO_{15}$, and a decoder DEC2 for controlling the demultiplexers of the demultiplexer circuit DMPX. In this case, the decoder DEC2 controls the demultiplexer circuit DMPX in accordance with the lower 4 bits RA1, RA0, CA1, and CA0 of a row address and a column address. Note that an AND circuit within the demultiplexer circuit DMPX is constructed by a complementary metal oxide semiconductor (CMOS) switch as illustrated in FIG. 16. Thus, the bus arranging circuit BAC1 connects the bus block $B_{ij}$ to the input/output terminal $IO_K$ as indicated by TABLE 3.

TABLE 3

| $B_{ij}$ | CA0 | 0 | 1 | 0 | 1 | 0 | 1 | 0 | 1 | 0 | 1 | 0 | 1 | 0 | 1 | 0 | 1 |
|---|---|---|---|---|---|---|---|---|---|---|---|---|---|---|---|---|---|
|   | CA1 | 0 | 0 | 1 | 1 | 0 | 0 | 1 | 1 | 0 | 0 | 1 | 1 | 0 | 0 | 1 | 1 |
|   | RA0 | 0 | 0 | 0 | 0 | 1 | 1 | 1 | 1 | 0 | 0 | 0 | 0 | 1 | 1 | 1 | 1 |
|   | RA1 | 0 | 0 | 0 | 0 | 0 | 0 | 0 | 0 | 1 | 1 | 1 | 1 | 1 | 1 | 1 | 1 |
| $B_{00}$ |  | 0 | 3 | 2 | 1 | 12 | 15 | 14 | 13 | 8 | 11 | 10 | 9 | 4 | 7 | 6 | 5 |
| $B_{01}$ |  | 1 | 0 | 3 | 2 | 13 | 12 | 15 | 14 | 9 | 8 | 11 | 10 | 5 | 4 | 7 | 6 |
| $B_{02}$ |  | 2 | 1 | 0 | 3 | 14 | 13 | 12 | 15 | 10 | 9 | 8 | 11 | 6 | 5 | 4 | 7 |
| $B_{03}$ |  | 3 | 2 | 1 | 0 | 15 | 14 | 13 | 12 | 11 | 10 | 9 | 8 | 7 | 6 | 5 | 4 |
| $B_{10}$ |  | 4 | 7 | 6 | 5 | 0 | 3 | 2 | 1 | 12 | 15 | 14 | 13 | 8 | 11 | 10 | 9 |
| $B_{11}$ |  | 5 | 4 | 7 | 6 | 1 | 0 | 3 | 2 | 13 | 12 | 15 | 14 | 9 | 8 | 11 | 10 |
| $B_{12}$ |  | 6 | 5 | 4 | 7 | 2 | 1 | 0 | 3 | 14 | 13 | 12 | 15 | 10 | 9 | 8 | 11 |
| $B_{13}$ |  | 7 | 6 | 5 | 4 | 3 | 2 | 1 | 0 | 15 | 14 | 13 | 12 | 11 | 10 | 9 | 8 |
| $B_{20}$ |  | 8 | 11 | 10 | 9 | 4 | 7 | 6 | 5 | 0 | 3 | 2 | 1 | 12 | 15 | 14 | 13 |
| $B_{21}$ |  | 9 | 8 | 11 | 10 | 5 | 4 | 7 | 6 | 1 | 0 | 3 | 2 | 13 | 12 | 15 | 14 |
| $B_{22}$ |  | 10 | 9 | 8 | 11 | 6 | 5 | 4 | 7 | 2 | 1 | 0 | 3 | 14 | 13 | 12 | 15 |
| $B_{23}$ |  | 11 | 10 | 9 | 8 | 7 | 6 | 5 | 4 | 3 | 2 | 1 | 0 | 15 | 14 | 13 | 12 |
| $B_{30}$ |  | 12 | 15 | 14 | 13 | 8 | 11 | 10 | 9 | 4 | 7 | 6 | 5 | 0 | 3 | 2 | 1 |
| $B_{31}$ |  | 13 | 12 | 15 | 14 | 9 | 8 | 11 | 10 | 5 | 4 | 7 | 6 | 1 | 0 | 3 | 2 |
| $B_{32}$ |  | 14 | 13 | 12 | 15 | 10 | 9 | 8 | 11 | 6 | 5 | 4 | 7 | 2 | 1 | 0 | 3 |
| $B_{33}$ |  | 15 | 14 | 13 | 12 | 11 | 10 | 9 | 8 | 7 | 6 | 5 | 4 | 3 | 2 | 1 | 0 |

Note that the numerals within TABLE 3 indicate the number of the input/output terminal IO. For example, "14" indicates $IO_{14}$.

Figure 18A:
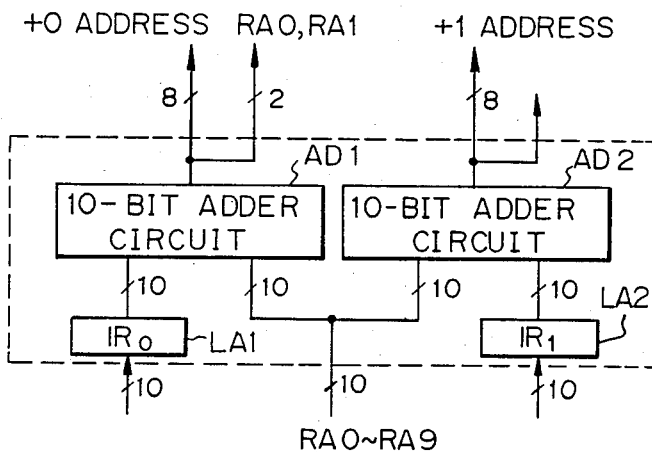
FIGS. 18A and 18B are circuit diagrams of the internal address calculation circuit added to FIG. 7.
Figure 18B:
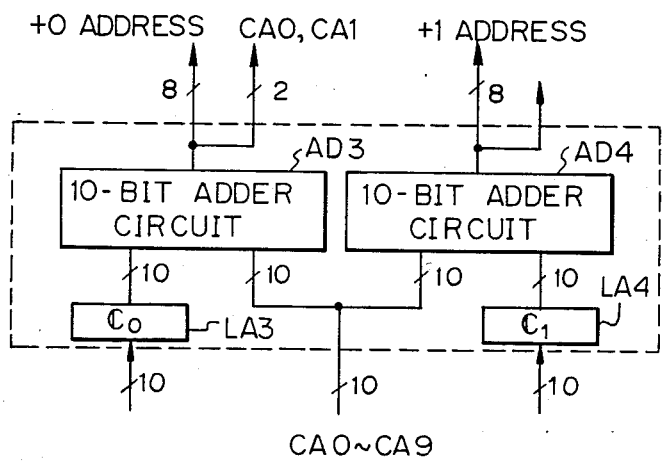

In the above-mentioned first embodiment, as illustrated in FIG. 17A, the pointing bit PB is located at a left and upper position of the bit group, however, it is possible to change the pointing bit PB as illustrated in FIG. 17B. In this case, the internal address calculation portion (i.e., the incremental circuits INR and INC) of FIG. 7 is changed to a general type as illustrated in FIGS. 18A and 18B. For example, in FIG. 18A, two ten-bit adders AD1 and AD2 are used for carrying out two subtracting operations for the external row addresses RA0 to RA9, and in each adder $|R_0| = -1$ (decimal denotation) and $|R_1| = 0$ (decimal denotation) are added. Among the 10 bit output of the adder AD1, the upper 8 bits are used as the +0 address, and the lower 2 bits are used as the row addresses RA0 and RA1. On the other hand, among the ten bit output of the adder AD2, the upper 8 bits are used as the +1 address, and the lower 2 bits are neglected. The same holds true in FIG. 18B. Thus, as illustrated in FIG. 17B, the location of the pointing bit PB can be changed. Note that the position of the pointing bit PB can be changed at an arbitrary position within a 4×4 face by changing the values of $|R_0|, |R_1|, |C_0|,$ and $|C_1|$ to other values. Further, the position of the pointing bit PB can be varied by setting the values $|R_0|, |R_1|, |C_0|,$ and $|C_1|$ in the registers LA1, LA2, LA3, and LA4, respectively. Note that, if the location of the pointing bit PB is changed, obviously the bus arranging circuit BAC1 is also changed.

Also, as illustrated in FIG. 17C, if a part of the output of the bus arranging circuit BAC1 are in a high impedance state, a boundary-free access of a 4×4 bit face can be changed to a boundary-free access of a 3×3 bit face. That is, it is easy to carry out a boundary-free access for a plurality of faces by using the same chip.

Thus, an access for a bit group having a voluntary magnitude is possible, and in addition, the conventional decoders can be used, thereby obtaining a boundary-free semiconductor memory device without reducing the capacity and integration thereof.

Figure 19:
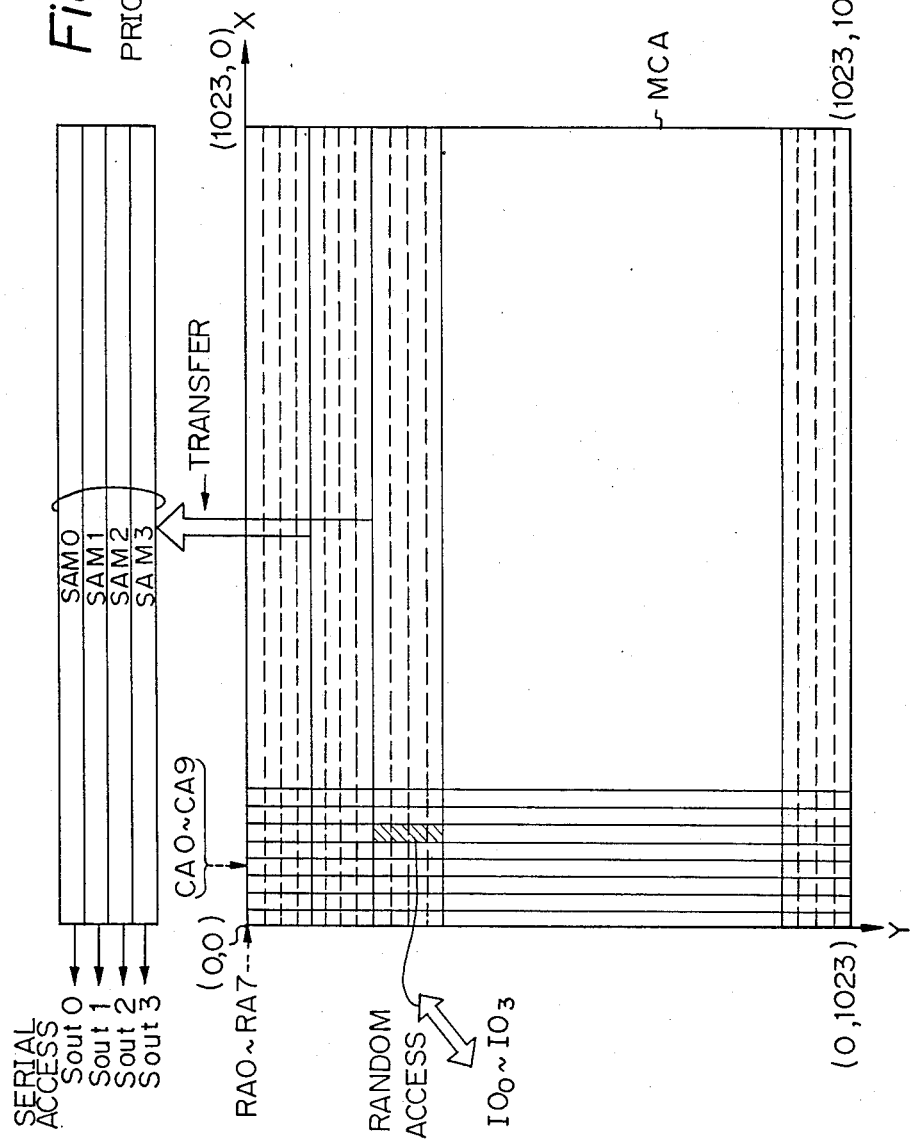
FIG. 19 is a diagram illustrating a prior art bit map configuration for a serial access mode.

Next, a prior art serial access will be explained with reference to FIG. 19. In FIG. 19, a bit map configuration for a 1 Mbit memory cell array MCA is also illustrated in the same way as FIG. 4. Further, serial access memories SAM0 to SAM3 are arranged along the rows of the memory cell array MCA. Here, each of the serial access memories comprises a 1024-bit shift register. Therefore, in a serial access mode, four rows of data of the memory cell array MCA are simultaneously transmitted in parallel to the serial access memories SAM0 to SAM3, and then serial data $S_{out0}$ to $S_{out3}$ is sequentially output therefrom. On the other hand, in a random access mode, four-bit cells indicated by the row address signals RA0 to RA7 and the column address signals CA0 to CA9 are accessed and are connected to input/output terminals $IO_0$ to $IO_3$.

In the device of FIG. 19, however, in a serial access mode, although a parallel transfer of the first to fourth rows and a parallel transfer of the fifth to eighth rows, ..., are carried out, it is impossible to access four rows adjacent to a voluntary position from the logic bit map plane even if an address is logically scrambled. That is, transfer boundary exist as indicated by solid lines in FIG. 19. In order to solve this problem, although a plurality of parallel transfers are carried out and a part of the serial access memories SAM0 to SAM3 is masked at each transfer, thereby obtaining voluntary adjacent four rows, the control is complex, the access time is long, and the sequence of adjacent rows of the obtained data is not in order.

On the other hand, in a random access mode in FIG. 19, the four bit cells shaded in FIG. 19 are connected to the random access input/output terminals $IO_0$ to $IO_3$, thereby accessing four bits. However, the four bits have boundaries in the column (X) direction as well as in the row (Y) direction. In this case, it is possible to access a voluntary 4-bit group by carrying out several accessed, but the control in this case is also complex, the access time is long, and adjacent data is also not in order.

Figure 20:
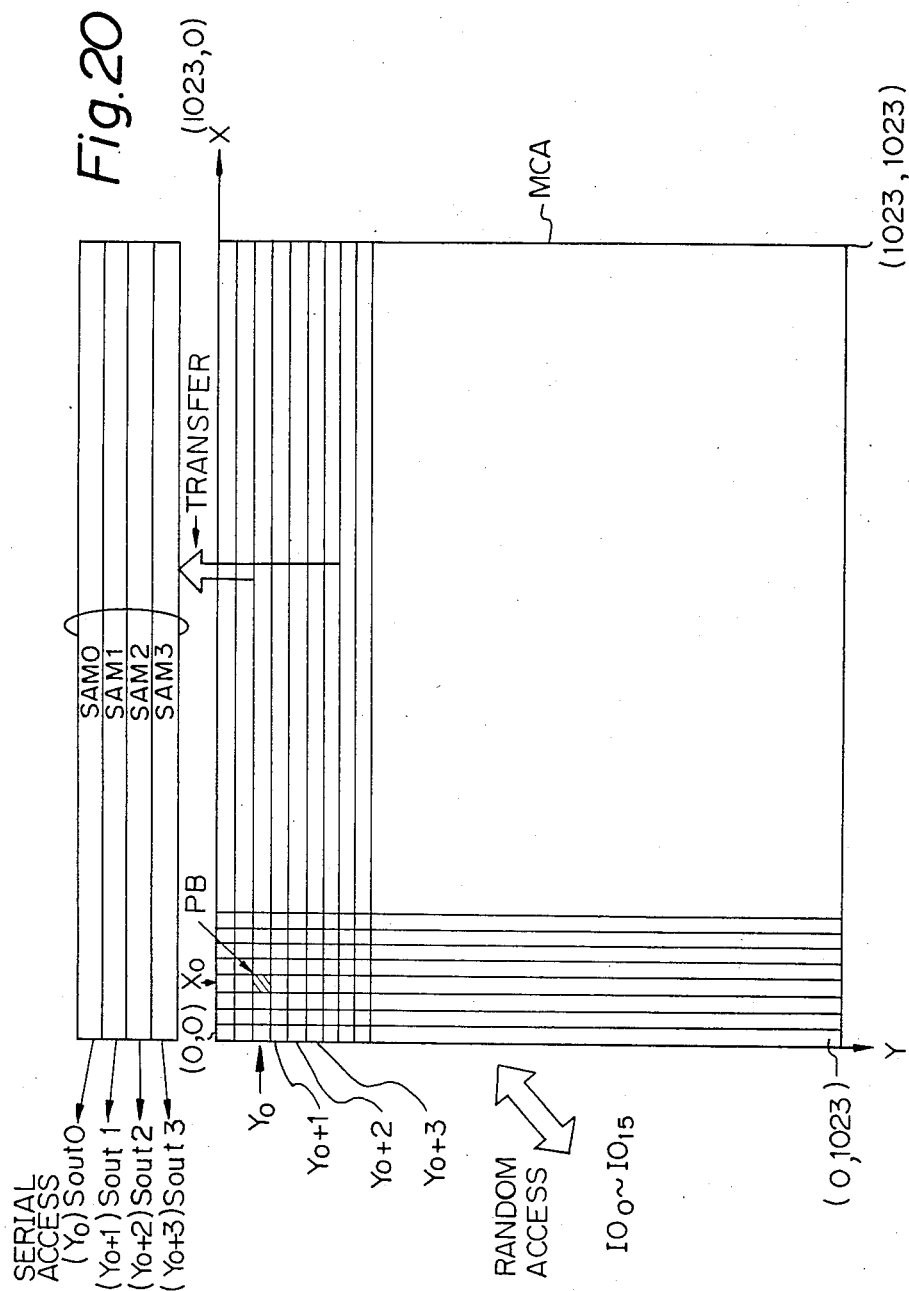
FIG. 20 is a diagram illustrating a bit map configuration for a serial access mode according to the present invention.

A boundary-free chip for a serial access mode according to the present invention will be explained with reference to FIG. 20. In FIG. 20, in a serial access mode, a voluntary row $Y_0$ ($0 \leq Y_0 \leq 1023$) is given by row addresses RA0 to RA9 as a transfer address to parallelly transmit four adjacent rows ($Y_0$, $Y_0+1$, $Y_0+2$, $Y_0+3$) to serial access memories SAM0 to SAM3, and then the rows are sequentially transmitted as serial data $S_{out0}$ to $S_{out3}$. At this time, the arranging circuit BAC2 (not shown) is operated so that the sequence of the serial data $S_{out0}$ to $S_{out3}$ is the rows $Y_0$, $Y_0+1$, $Y_0+2$ in this order, regardless of the row addresses for $Y_0$.

Note that the random access of FIG. 4 also holds true for the chip of FIG. 20.

Figure 21:
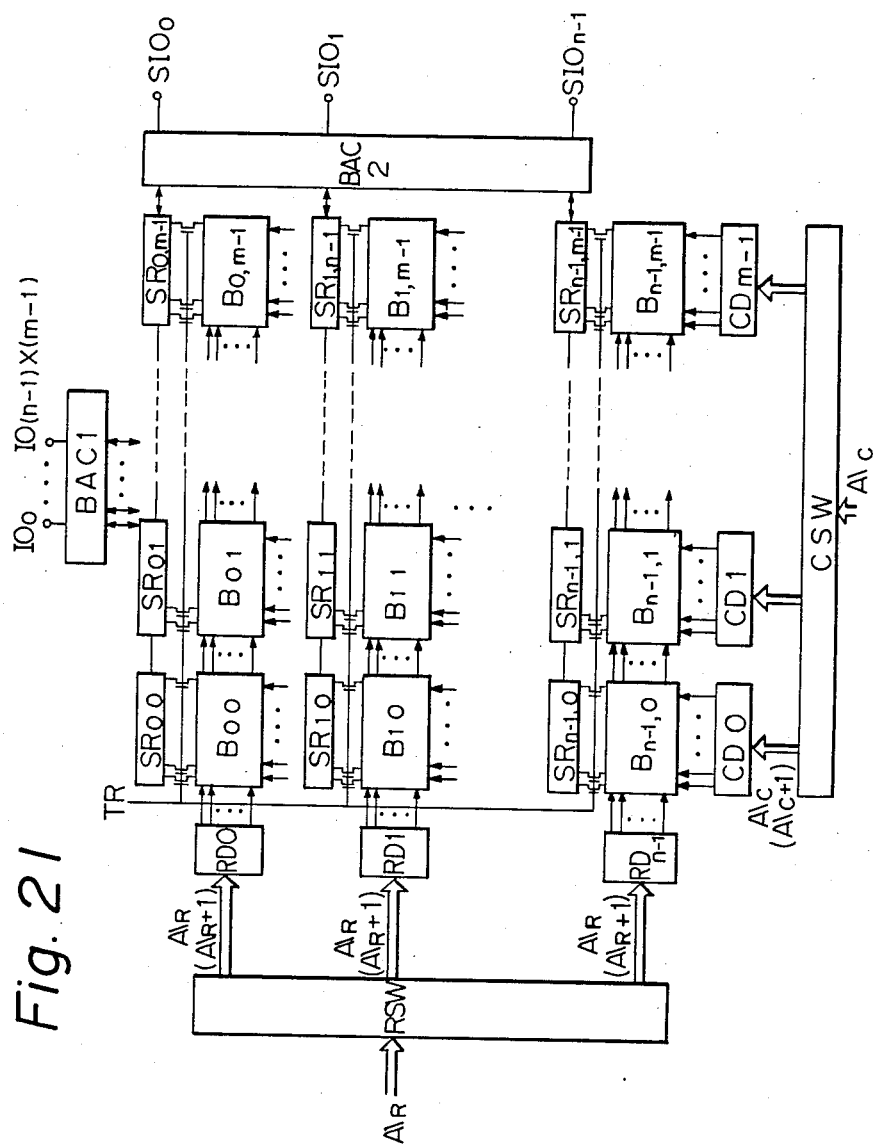
FIG. 21 is a circuit diagram illustrating a second embodiment of the boundary-free semiconductor memory device according to the present invention.

In FIG. 21, which illustrates a second embodiment of the boundary-free semiconductor memory device according to the present invention, n×m serial transfer circuits $SR_{00}$, $SR_{01}$, ..., and $SR_{n-1,m-1}$, an arranging circuit BAC2, and a batch transfer means TR are added to the elements of FIG. 6. The transfer circuits $SR_{00}$, $SR_{01}$, ..., and $SR_{n-1,m-1}$ are in parallel with the memory cell blocks $B_{00}$, $B_{01}$, ..., and $B_{n-1,m-1}$, respectively. In a serial access mode, the batch transfer circuit TR connects one row of each of the memory cell blocks such as $B_{00}$, $B_{01}$, ..., $B_{0,m-1}$ accessed by the row selecting circuit, simultaneously the respective serial transfer circuits such as $SR_{00}$, $SR_{01}$, ..., and $SR_{0,m-1}$, and the arranging circuit BAC2 rearranges and connects the serial transfer circuits to n serial input/output terminals $SIO_0$ to $SIO_{n-1}$. Thus, in a serial access mode, n rows such as four rows adjacent to a voluntary position of the logic bit map plane are accessed, and the rows are accessed in the sequence of the adjacent row by the arranging circuit by BAC2. Therefore, it is possible to access a desired n-rows bit group as well as a desired rectangular bit group.

Figure 22B:
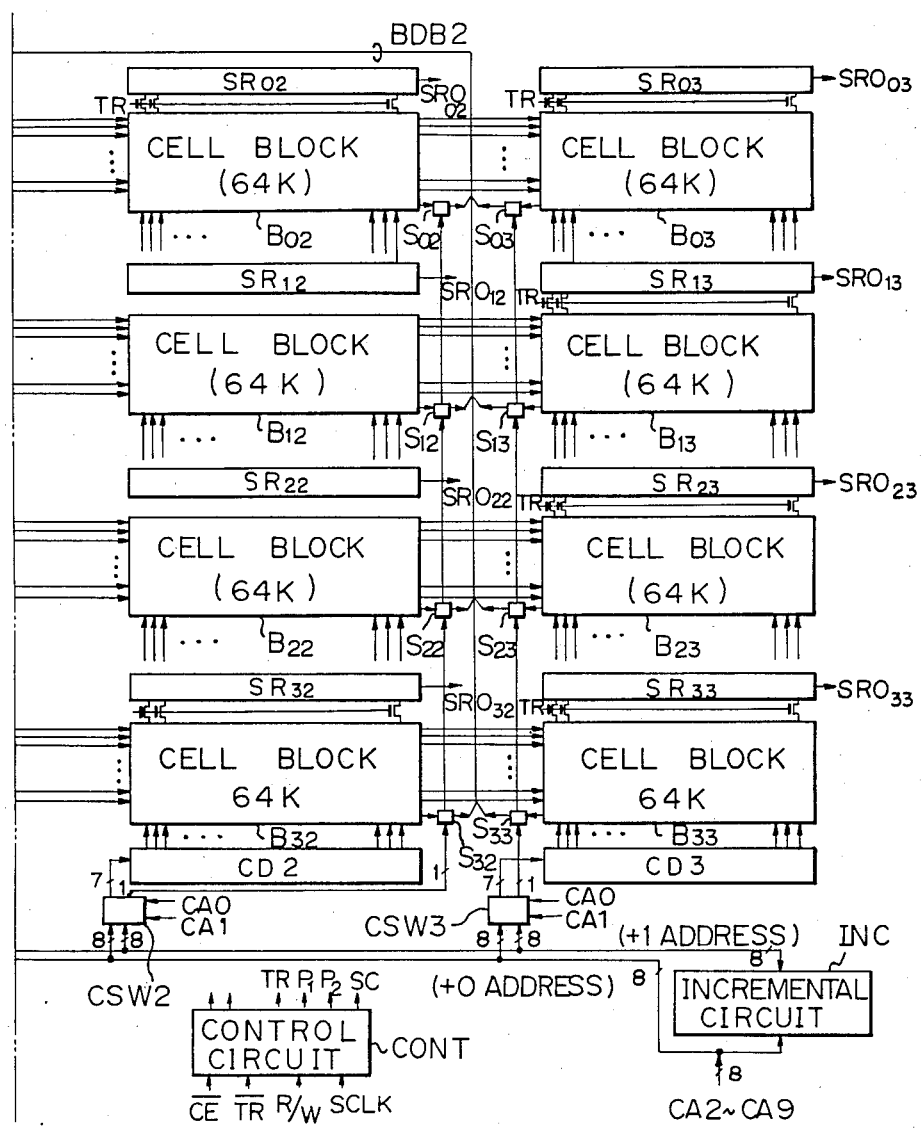
Figure 22C:
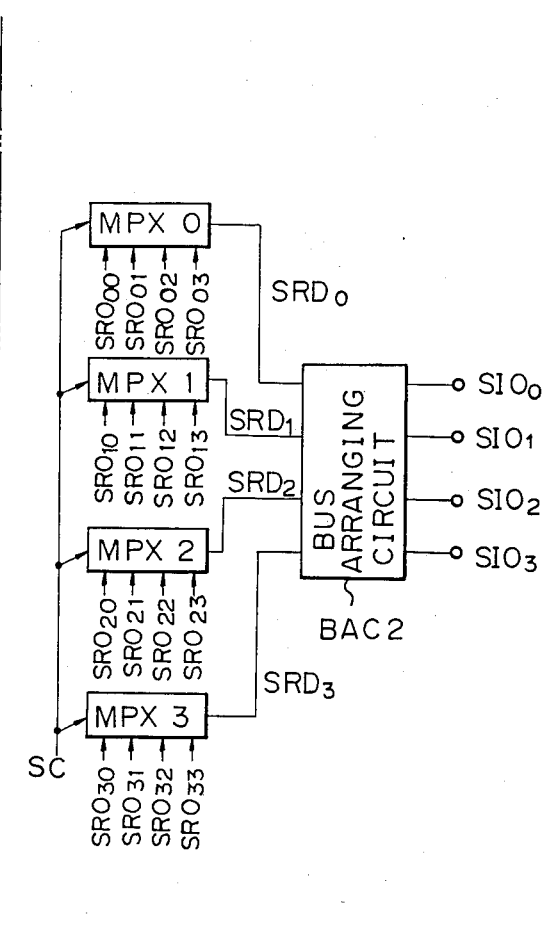

The second embodiment of FIG. 21 will be explained in more detail with reference to FIG. 22. In FIG. 22, elements for a serial access mode are added to the elements of FIG. 7. That is, a shift register $SR_{ij}$ is arranged along the row direction of each of the cell blocks $B_{ij}$ (i=0∼3, j=0∼3), and the output $SRO_{ij}$ is connected to multiplexers MPX0 to MPX3. Further, the sequence of serial data buses $SRD_0$ to $SRD_3$ of the multiplexer MPX0 to MPX3 is changed by a bus arranging circuit BAC2, and is connected to input/output terminals $SIO_0$ to $SIO_3$ for a serial access mode. Also, in a serial access mode, the row-side switches RSW0 to RSW3 are operated in the same way as in a random access mode, and as a result, the voluntary four rows $Y_0$, $Y_0+1$, $Y_0+2$, and $Y_0+3$ ($Y_0$ is the row address of the pointing bit PB) are selected. Then, the rows are simultaneously transmitted in parallel via transfer gates to the shift registers of 1024 bits×4 rows. Note that the 1024 bit×one row shift register is comprised of shift registers $SR_{i0}$, $SR_{i1}$, $SR_{i2}$, and $SR_{i3}$ provided in parallel to the four cell blocks. Subsequently, data is read out of the 1024 bits×4 rows shift registers at a high speed clock rate such as about 20 to 30 MHz without addresses at an asynchronous mode of a random access and a serial access.

Since the allocation of the bit map to the blocks is carried out as illustrated in FIG. 8, the adjacent 256 sense amplifiers (see FIG. 23) of the cell blocks $B_{i0}$, $B_{i1}$, $B_{i2}$, and $B_{i3}$ have every other four bits. For this purpose, the multiplexers MPX0 to MPX3 carry out a parallel/serial transformation from 4 bits to 1 bits. Therefore, the shift registers $SR_{00}$ to $SR_{33}$ are operated by shift signals $P_1$ and $P_2$ having four times the period of a serial clock signal SC of the multiplexers MPX0 to MPX3. Then, four serial data buses $SRD_0$ to $SRD_3$ are rearranged and connected to the four serial input/output terminals $SIO_0$ to $SIO_3$.

Also, the control circuit CONT receives external signals such as a chip enable signal $\overline{CE}$, a batch transfer signal $\overline{TR}$ for a serial access mode, a read/write signal R/W, and a serial clock signal SCLK and generates various internal signals such as the batch transfer signal TR, the shift clock signals $P_1$ and $P_2$, and the serial clock signal SC. For example, the external shift clock signal SCLK is buffered to generate an internal shift clock signal SC which is four-divided to generate the shift clock signals $P_1$ and $P_2$. Further, the internal batch transfer signal TR is generated from the chip enable signal $\overline{CE}$ and the external transfer signal $\overline{TR}$.

Figure 23:
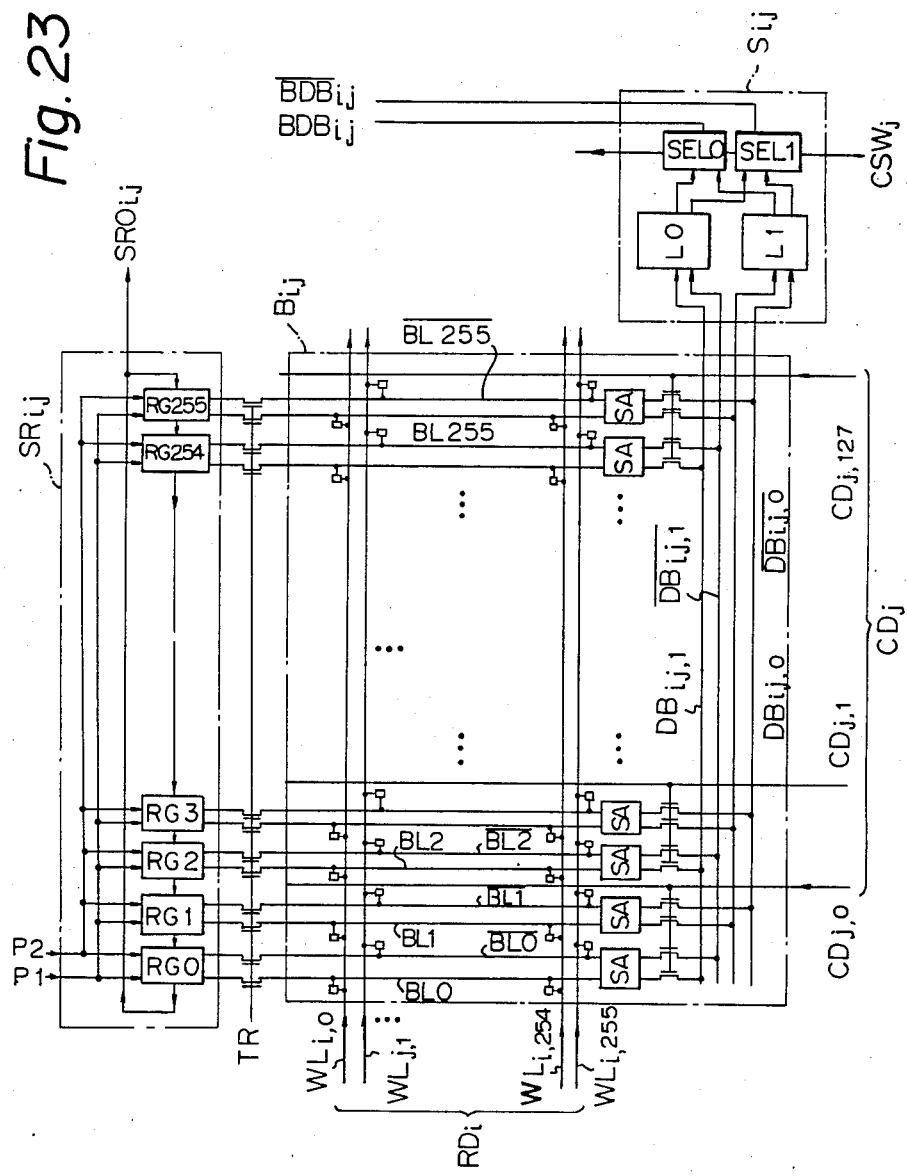
FIG. 23 is a detailed circuit diagram of the memory cell block and the shift register of FIG. 22.

In FIG. 23, which is a detailed circuit diagram of the cell block $B_{ij}$, the shift register $SR_{ij}$, and the like of FIG. 22, the shift register $SR_{ij}$ is comprised of 256 registers RG0 to RG255 which are cyclicly operated by the shift clock signals $P_1$ and $P_2$, and the output of the register RG0 is output as the output $SRO_{ij}$ of the shift register $SR_{ij}$. The other circuits such as the cell block $B_{ij}$ of FIG. 23 are the same as those of FIG. 9.

Note that the operation of a random access mode of the device of FIG. 22 is the same as that of the device of FIG. 7.

Next, a serial access mode will be explained.

Figure 24A:
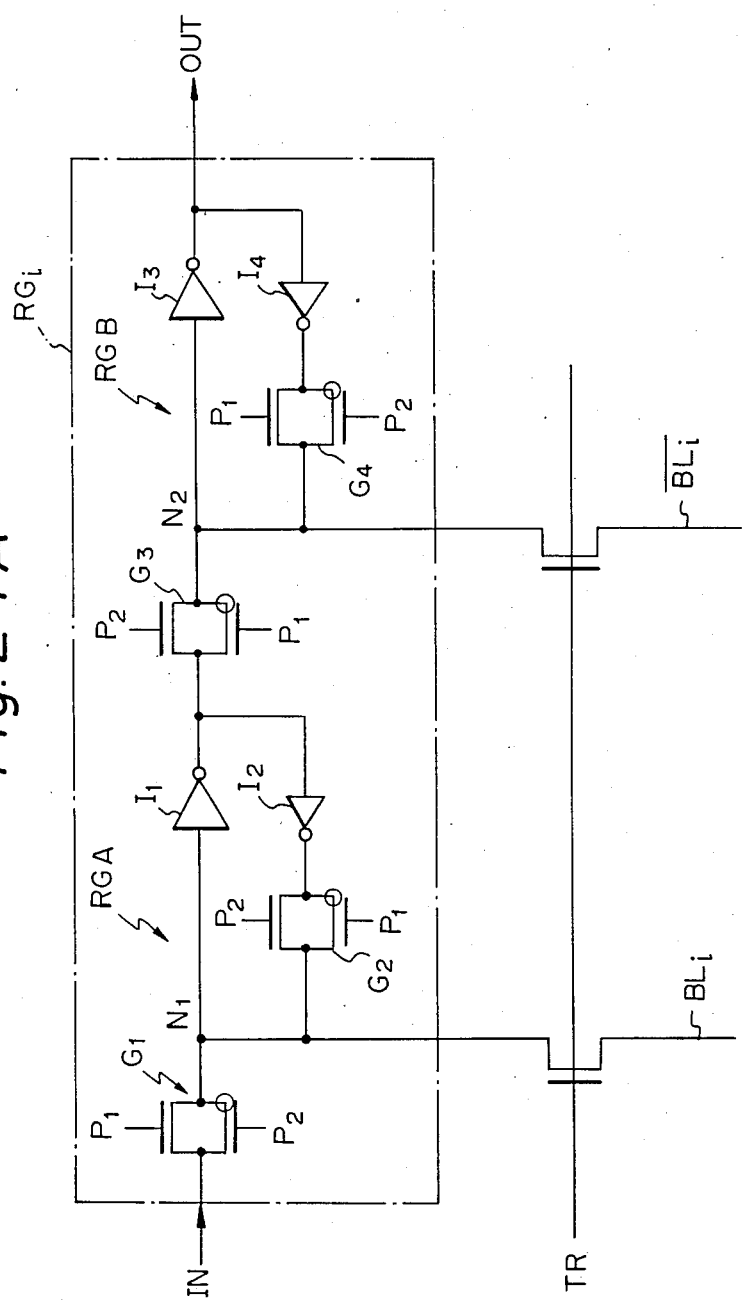
FIGS. 24A and 24B are circuit diagrams of examples of the shift register of FIG. 23.
Figure 24B:
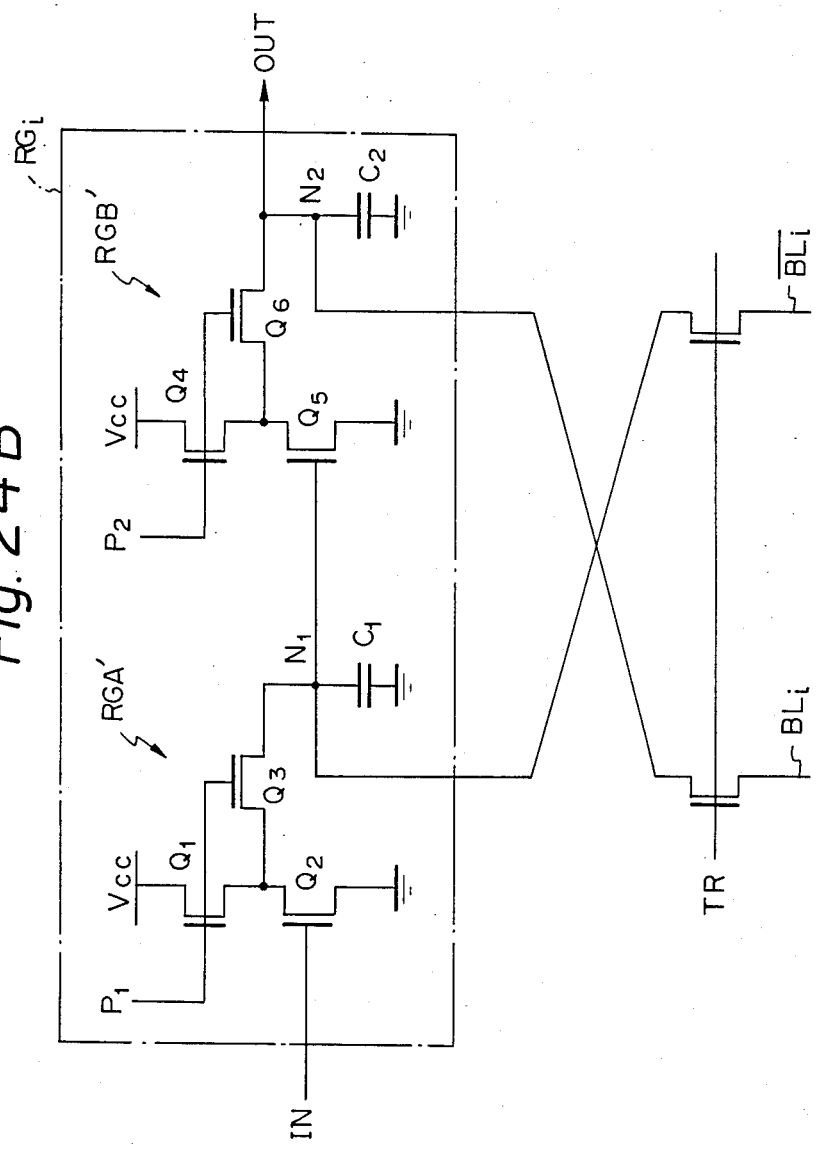

FIGS. 24A and 24B are detailed circuit diagrams of the shift register $RG_i$. In FIG. 24A, the shift register $RG_i$ is composed of two bit shift registers RGA and RGB formed by CMOS's. Each of the shift registers RGA (RGB) comprises CMOS transmission gates $G_1$ and $G_2$ ($G_3$ and $G_4$), and CMOS inverters $I_1$ and $I_2$ ($I_3$ and $I_4$). Each of the shift registers RGA and RGB is shifted by the shift block signal $P_1$ (high level) and is latched by the shift clock signal $P_2$ (high level). Also, in FIG. 24B, the shift register $RG_1$ is comprised of two bit shift registers RGA' and RGB' by NMOS dynamic circuits. Each of the shift registers RGA' (RGB') comprises transistors $Q_1$ to $Q_3$ ($Q_4$ to $Q_6$) and a capacitor $C_1$ ($C_2$). Each of the shift registers RGA' and RGB' is shifted by the high level of (or the low level of) the shift clock signal $P_1$ and is transmitted by the high level (or the low level) of the shift clock signal $P_2$. In this case, however, a transfer mode depends upon the potentials at nodes $N_1$ and $N_2$ and the potential of the shift clock signals $P_1$ and $P_2$.

For example, the operation of the shift register of FIG. 24A will be explained with reference to timing diagrams of FIGS. 25A to 25C. The control circuit CONT generates the shift clock signals $P_1$ and $P_2$ of FIGS. 25A and 25B having 4 times the period of the shift clock signal SC of FIG. 25C. Therefore, when the control enters a serial access mode after a batch parallel transfer (TR="1"), the transmission gates $G_1$ and $G_4$ are opened by the high level of the shift clock signal $P_1$, so that the potential at the node $N_2$ is transmitted to the next node. Then, the transmission gates $G_2$ and $G_3$ are opened by the high level of the shift clock signal $P_2$ so that the latch circuits formed by the inverters $I_1$ and $I_2$; and $I_3$ and $I_4$ are latched. Thus, a bit-by-bit shift is carried out by one period $T_2$ of the shift clock signal $P_1$ ($P_2$). Note that the shift clock signals $P_1$ and $P_2$ are generated by dividing the shift clock signal SC which has, for example, a period of 30 to 40 ns, however, the high levels thereof are not superimposed on each other.

FIGS. 26A through 26E are timing diagrams showing a batch parallel transmission of data of the cell block $B_{ij}$ to the shift register $SR_{ij}$. Note that, in a batch parallel transfer mode a serial transfer within the shift register $SR_{ij}$ is prohibited. That is, the shift clock signal $P_1$ is made low level and the shift clock $P_2$ is made high level. For example, at time $t_1$, four word lines are selected by the operation of the $\overline{CE}$ system as illustrated in FIG. 26B, and then each of the sense amplifiers in operated. As a result, at time $t_2$, there is a difference in potential between the bit lines $BL_i$ and $\overline{BL_i}$. Then, at time $t_3$, a batch of the potentials at the bit lines are transmitted by the internal transfer signal TR to the nodes $N_1$ and $N_2$ of each of the shift registers $RG_{ij}$ (see FIGS. 24A and 24B)

of the shift register $SR_{ij}$. As a result, the potentials at the bit lines are latched by the nodes $N_1$ and $N_2$ as illustrated in FIG. 26D. At this time, the output OUT of the first shift register RG0 is changed as illustrated in FIG. 26E. Thus, after a batch parallel transfer operation, each of the shift registers $SR_{ij}$ carries out a serial transfer as a serial access mode.

As explained hereinafter, a parallel/serial transformation of 4 bits to 1 bit by the four multiplexers MPX0 to MPX3 is performed upon the serial output $SRO_{ij}$ transmitted from each of the shift register $SR_{ij}$. Each of the multiplexers $MPX_i$ is comprised of four shift registers $SRX_0$ to $SRX_3$ as shown in FIG. 27, and these shift registers are operated by the shift clock signal SC. The serial data buses $SRD_0$ to $SRD_3$ of the four multiplexer MPX0 to MPX3 are connected to a bus arranging circuit BAC2.

Figure 28:
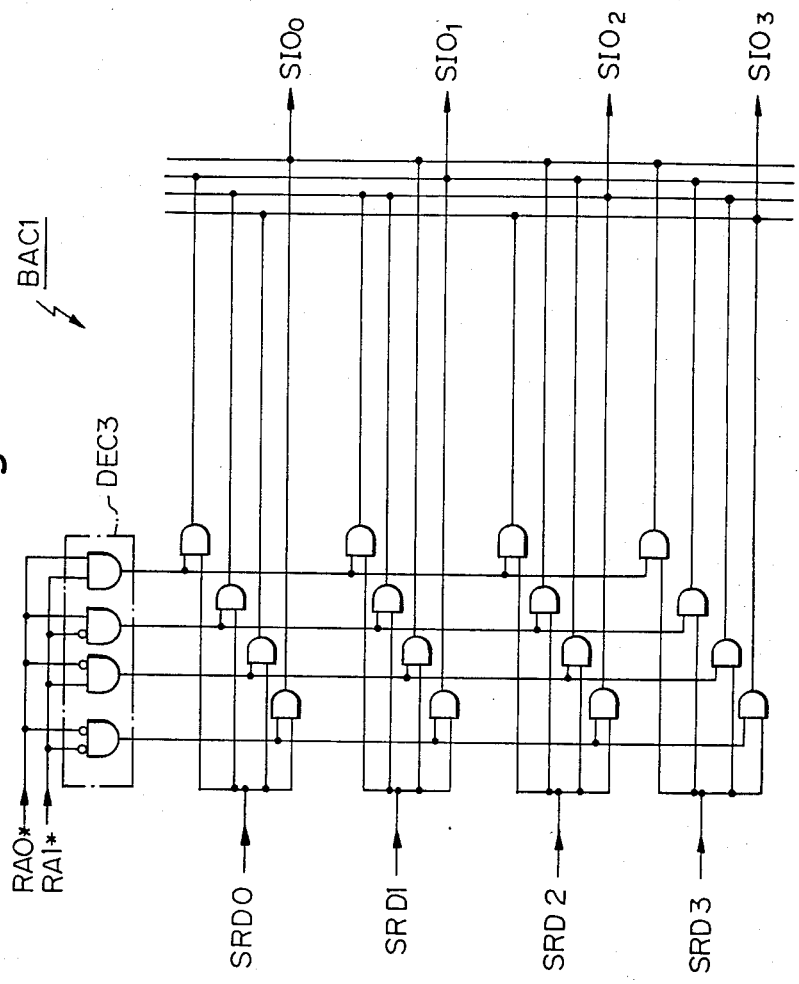
FIG. 28 is a detailed circuit diagram of the bus arranging circuit of FIG. 22.

The bus arranging circuit BAC2 is constructed as illustrated in FIG. 28, and as a result, the sequence of the Y coordinates $Y_0$, $Y_0+1$, $Y_0+2$, and $Y_0+3$ on the bit map of FIG. 20 corresponds to the serial input/output terminals $SIO_0$ to $SIO_3$. At this point, there are four cases which are selected by a decoder DEC3 using the row addresses RA0* and RA1*. Note that the row addresses RA0* and RA1* are the values which are latched in the register (not shown) in a batch parallel transfer mode. Also note that each of the AND circuits of FIG. 28 is, for example, illustrated in FIG. 16.

Thus, the four rows $Y_0$, $Y_0+1$, $Y_0+2$, and $Y_0+3$ on the bit map are transmitted in parallel to the four-row shift registers SAM0, SAM1, SAM2, and SAM3 and in this case, although the four rows are not always in the sequence $Y_0$, $Y_0+1$, $Y_0+2$, and $Y_0+3$, the sequence is $Y_0$, $Y_0+1$, $Y_0+2$, and $Y_0+3$ in a serial transfer for the serial input/output terminals $SIO_0$ to $SIO_3$.

Figure 29:
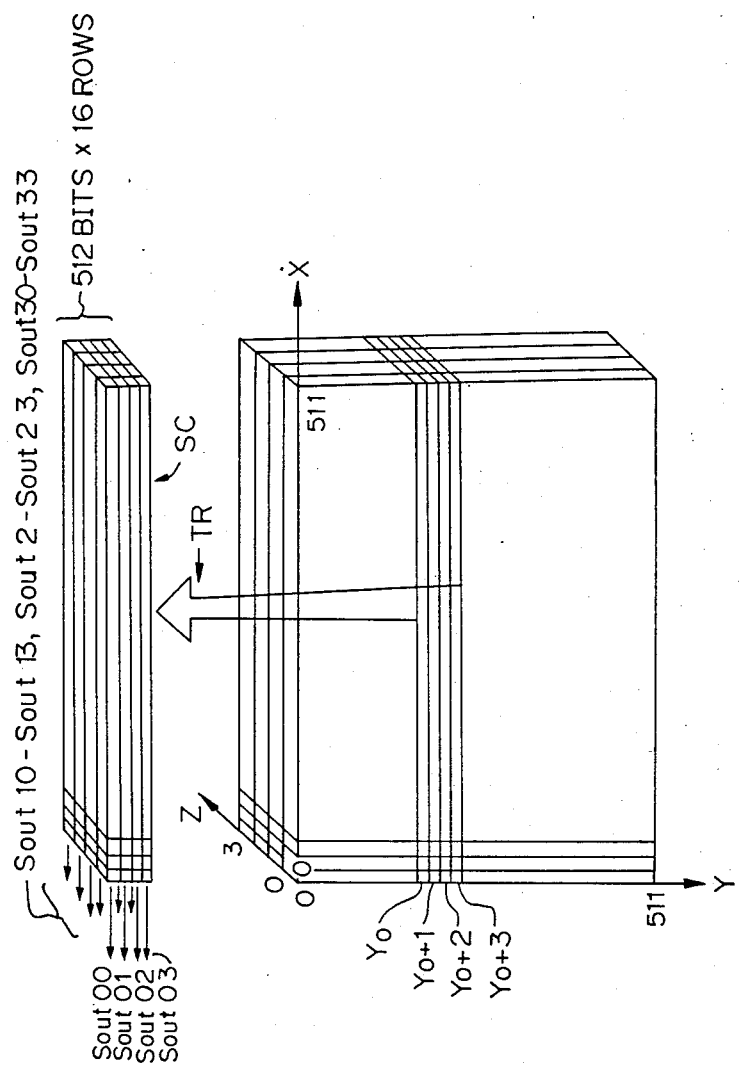
FIG. 29 is a modification of FIG. 20.

Note that, in the above-mentioned embodiments, although the bit map is given by a plane (two-dimensions X and Y), the present invention can be extended for a space (three-dimensions X, Y, and Z) as illustrated in FIG. 29 by using a similar hierarchy technique. Further, in a video data processing or the like, for video data between adjacent addresses stored in such a video memory device, data processings or a dust removing processing such as (1) compression processing, (2) difference processing, (3) smoothing processing, and the like are often carried out, thereby obtaining new data for a center bit, as explained above, for example, $3 \times 3$ data as shown in FIG. 30 is read, and the center bit as is renewed by $$a_0 \leftarrow \frac{1}{10} \{2a_0 + (a_1 + a_2 + a_3 + a_4 + a_5 + a_6 + a_7 + a_8)\}$$

In this case, the processing speed is increased by serially outputting adjacent rows by a serial access mode. Note that, in the dual part dynamic random access memory (RAM) according to the second embodiment, a cycle of a random access is about 200 to 300 ns, and a cycle of a serial access is about 30 to 50 ns, and therefore, the above-mentioned advantage is clear.

In FIG. 31, which illustrates a third embodiment of the boundary-free semiconductor memory device, only a function for a serial access mode is provided. That is, memory cells are divided into n-rows memory cell blocks $B_0, B_1, \ldots,$ and $B_{n-1}$, and n serial transfer circuits $SR_0, SR_1, \ldots,$ and $SR_{n-1}$ are provided in parallel with the row direction of each of the memory cell blocks. Also, n-row selecting circuits RD0, RD1, ..., and $RD_{n-1}$ of the same type are commonly provided for each row of the memory cell blocks, and a switching circuit RSW gives a row address $A_r$ or a row address $A_R+1$ adjacent to said row address to each of the row selecting circuits $RD_0$, $RD_1, \ldots,$ and $RD_{n-1}$. In a serial access mode, a batch transfer means TR connects one row of each of the memory cell blocks accessed by each of the row selecting circuits to the respective serial transfer circuits, and an arranging circuit BAC2 rearranges and connects each of the serial transfer circuits $SR_o$ to $SR_n$ serial input/output terminals $SIO_0$ to $SIO_{n-1}$. Thus, a voluntary n row bit group can be accessed. Note that, in FIG. 31, although the memory cells are divided into memory cell blocks of n rows $\times$ one column, the memory cells can be also divided into memory cell blocks of n rows $\times$ n columns ($n \geq 2$, $m \geq 2$).

According to the third embodiment of the present invention, in a serial access mode, the adjacent n rows in this sequence are accessed and a transfer boundary does not exist.

I claim:

1. A semiconductor memory device comprising:
   n rows $\times$ m columns of memory cell blocks;
   row selecting means provided for each row of said memory cell blocks respectively;
   m column selecting means provided for each column of said memory cell blocks respectively;
   a first switching means, connected to said row selecting means, for supplying a row address or a row address adjacent to said row address to each of said row selecting means;
   a second switching means, connected to said column selecting means, for supplying a column address or a column address adjacent to said column address to each of said column selecting means; and
   arranging means, connected to said memory cell blocks, for rearranging n rows $\times$ m columns of cells of said memory cell blocks selected by said row selecting means and said column selecting means, thereby accessing a voluntary group of n rows $\times$ m columns of bits in a random access mode.

2. A device as set forth in claim 1, wherein said first and second switching means comprises means for accessing a pointing bit at a special point in said voluntary group of n rows $\times$ m columns of bits.

3. A device as set forth in claim 2, wherein said pointing bit accessing means comprises means for changing said special point.

4. A device as set forth in claim 3, wherein a part of outputs of said arranging means are in a high impedance state, thereby accessing a voluntary group of n' rows $\times$ m' column of bits (n' $\leq$ n, m' $\leq$ m).

5. A device as set forth in claim 3, further comprising:
   n rows $\times$ m columns of serial transfer means, each provided in parallel with the row direction of one of said memory cell blocks;
   a batch transfer means, connected to said serial transfer means and to said memory cell blocks, for carrying out a batch transfer therebetween; and
   another arranging means, connected to said serial transfer means, for rearranging n rows of said serial transfer for n serial input/output terminal, thereby accessing a voluntary group of n-rows of bits in a serial access mode.

6. A device as set forth in claim 5, wherein a part of outputs of said another arranging means are in a high impedance state, thereby accessing a voluntary group of n'-rows (n'≦n) of bits.

7. A device as set forth in claim 5, wherein each of said serial transfer means comprises a shift register
said device further comprising n multiplexers, each connected between one row of said shift register and said another arranging means.

8. A semiconductor memory device comprising:
n-rows of memory cell blocks;
serial transfer means each provided in parallel with the row direction of one of said memory cell blocks;
row selecting means provided commonly for each row of said memory cell blocks respectively;
a switching means, connected to said row selecting means, for supplying a row address or a row address adjacent to said row address to each of said row selecting means;
a batch transfer means, connected to said serial transfer means and to said memory cell blocks, for carrying out a batch transfer therebetween;
an arranging means, connected to said serial transfer means, for rearranging n rows of said serial transfer for n serial input/output terminals, thereby accessing a voluntary group of n-rows bits in a serial access mode.

9. A device as set forth in claim 8, wherein a part of outputs ($SIO_0$ to $SIO_{n-1}$) of said arranging means are in a high impedance state, thereby accessing a voluntary group Of n'-rows (n'≦n) of bits.

10. A device as set forth in claim 8, wherein each of said serial transfer means comprises a shift register
said device further comprising multiplexers, each connected between one row of said shift register and said arranging means.

* * * * *